United States Patent
Fukuzumi et al.

(10) Patent No.: US 7,135,735 B2
(45) Date of Patent: Nov. 14, 2006

(54) SEMICONDUCTOR DEVICE

(75) Inventors: Yoshiaki Fukuzumi, Kanagawa (JP);
Takeshi Kajiyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/791,749

(22) Filed: Mar. 4, 2004

(65) Prior Publication Data

US 2004/0227248 A1    Nov. 18, 2004

(30) Foreign Application Priority Data

Mar. 4, 2003   (JP) .............................. 2003-056871

(51) Int. Cl.
*H01L 29/76* (2006.01)
(52) U.S. Cl. ...................... 257/314; 257/350
(58) Field of Classification Search ................ 257/314, 257/350
See application file for complete search history.

(56) References Cited

U.S. PATENT DOCUMENTS 5,567,629 A * 10/1996 Kubo ...................... 438/286

2003/0032295 A1 * 2/2003 Park et al. .................. 438/700
2004/0227248 A1   11/2004 Fukuzumi et al.
2005/0121710 A1 * 6/2005 Shino

* cited by examiner

*Primary Examiner*—Long Pham
(74) *Attorney, Agent, or Firm*—Oblon, Spivak, McClelland, Maier & Neustadt, P.C.

(57) ABSTRACT

A semiconductor device comprising: a support substrate; an embedded insulating layer formed on the support substrate; a semiconductor layer on the embedded insulating layer; at least an element region formed in the semiconductor layer; a plurality of source/drain regions of a first conductivity type, formed in the element region at predetermined intervals; a plurality of body regions of a second conductivity type, sandwiched between a pair of adjacent ones of the source/drain regions in the element region; and a gate formed on each of the body regions with a gate insulating film being laid between them, each of the source/drain regions including: an inner high-concentration portion extending to the embedded insulating layer, and an outer low-concentration portion surrounding the inner high-concentration portion and having a direct contact with the body regions.

7 Claims, 24 Drawing Sheets

(A)

(D)

(E)

(A)

(B)

(C)

(D)

(C)

(D)

(C)

(D)

(C)

(D)

(B)

(C)

(D)

(E)

(C)

(D)

(F)

US 7,135,735 B2

SEMICONDUCTOR DEVICE

CROSS-REFERENCE TO RELATED APPLICATION

This application is based upon and claims the benefit of priority from prior Japanese Patent Application No. 2003-056871, filed on Mar. 4, 2003, the entirety of which is incorporated herein by reference.

BACKGROUND OF THE INVENTION

1. Field of the Invention

The present invention generally relates to semiconductor devices, and more particularly to a semiconductor device suitable for use as a floating-body cell (will be referred to as "FBC" hereunder) type semiconductor memory having a charge-storage region.

2. Background Art

In the field of semiconductor memories, there has been used the 1T-1C (one transistor/one capacitor) type DRAM. Currently, however, it appears that the cell size cannot further be reduced, and therefore a semiconductor memory having a new structure has been sought. A semiconductor device having a data storage region formed under a transistor itself has been proposed as one of the typical examples of such a new-structure semiconductor memory thus sought.

The FBC memory is known as such a semiconductor device. It was introduced during a lecture given in the ISSCC 2002 (International Solid-State Circuit Conference 2002, held in San Francisco, Mar. 3–7, 2002). The details of this memory were clarified in "ISSCC 2002/SESSION 9/DRAM AND FERROELECTRIC MEMORIES /9.1/ Memory Design Using One-Transistor Gain Cell on SOI/ Takashi Ohsawa et al." An FBC memory made experimentally under the 0.175-µm rule was reported as an example.

The above FBC cell includes an MOS transistor formed on an SOI (silicon on insulator) substrate. It has no separate charge-storage capacitor but a charge-storage region formed under the transistor.

Since the semiconductor device having the above structure needs no separate capacitor, it can easily be miniaturized, integrated to a higher degree, and have the speed of operation enhanced.

Note that generally, the demand for mounting the semiconductor device along with a higher-speed logic LSI in one chip has been larger and larger and also a higher consistency of the logic LSI with the manufacturing process has also been demanded for a simpler process.

FIGS. 22 to 25 show together an FBC memory as a typical example of the conventional semiconductor devices known to the Inventors of the present invention. FIG. 22 is a plan view, FIG. 23 shows sectional views of the conventional semiconductor device, taken along lines B—B and C—C, respectively, in FIG. 22, FIG. 24 shows sectional views taken along lines D—D and E—E, respectively, FIG. 22, and FIG. 25 is a plan view corresponding to FIG. 22. FIG. 25 shows a physical relationship between strip-shaped element isolation films 8 and, silicon layers 4 sandwiched between the isolation films 8 and diffusion layers 6S and 6D formed as source/drain layers on the silicon layers 4, among others.

As especially shown in FIG. 23(B), the above conventional semiconductor device is formed on an SOI substrate 100. The SOI substrate 100 is a lamination of a support substrate (p-type semiconductor substrate) 1, n-type diffusion layer 2, embedded oxide film ($SiO_2$) 3 and a p-type silicon layer 4.

As especially shown in FIGS. 24(D) and 24(E) and 25, the uppermost silicon layer 4 has the element isolation films 8 formed thereon. As especially shown in FIG. 25, the element isolation films 8 is strip-shaped and extend horizontally in the plane of the drawing. As also shown in FIG. 23(C), these element isolation films 8 extend horizontally (in the plane of the drawing) below and between bit lines BL that will be described in detail later. As shown in FIG. 25, ones of the silicon layers 4, located between the element isolation layers 8, are so-called strip-shaped element regions 4a. The strip-shaped element regions 4a overlap the bit lines BL vertically and extend under, and in the same direction as, the bit lines BL in the plane of FIG. 22(A). Each of the strip-shaped element regions 4a has $N^+$ diffusion layers 6D and 6S formed thereon at predetermined intervals as especially shown in FIGS. 23(B) and 25. In the case of one of these element regions 4a, for example, the element region 4a(j), parts thereof sandwiched between the diffusion layers 6D and 6S provide the silicon regions 4b in which channels are to be formed. Further, of the diffusion layers 6S and 6D, the diffusion layer 6S forms a source and the diffusion layer 6D forms a drain. They are alternately arranged as shown. As shown in FIG. 23(B), hot holes developed when a current flows from the drain (diffusion layer 6D) to the source (diffusion source 6S) via the silicon region 4b where the channel is to be formed are stored in the silicon region 4b. Gate electrodes 7 are formed on the silicon regions 4b with gate oxide layers 6 being laid between them. As shown in FIG. 22(A), the gate electrodes 7 are strip-shaped and extend vertically in the plane of the drawing. Also, on the diffusion layers 6S, there are formed source line SL each of which is a lamination of a strip-shaped contact plug 9S and a strip-shaped metal layer 10S. The contact plug 9S and metal layer 10S extend vertically in the plane of FIG. 22(A). Also, the diffusion layer 6D have each bit line BL extending horizontally as in FIG. 22(A) connected thereto via columnar contact plugs 9D as contacts. Note that the reference 11 indicates an interlayer insulating layer.

As seen from the above and as especially shown in FIG. 25, the silicon layers 4 are sandwiched between the element isolation films 8 to have a strip-like shape and extend horizontally in the plane of the drawing and the cells adjacent to each other in the plane of the drawing are isolated from each other by the $N^+$ diffusion layers 6S and 6D being a source/drain, respectively.

However, in case the memory cell is miniaturized to such a high degree that the bit line of the $N^+$ diffusion layer 7 is as short as 0.1 µm or so in the 0.1-µm generation, for example, the bipolar operation among P, $N^+$ and P taking place among the adjacent cells in FIG. 23(B) is not negligible and data stored in the cells will be damaged due to their mutual interference in the worst case.

The above problem will be solved by raising the impurity concentration in the $N^+$ diffusion layers 6S and 6D being a source/drain, respectively. In the case of the FBC structure, however, such a raised impurity concentration will increase the junction leakage between a floating body as a memory region and the source/drain, resulting in a considerably low data storage function.

As above, the conventional semiconductor device has such a problem that a higher integration results in an insufficient isolation between elements and increasing the impurity concentration in the diffusion layers forming a source and drain, respectively, to improve the inter-cell isolation results in the junction leakage current and also in a deteriorated storage capability of the floating body.

SUMMARY OF THE INVENTION

Accordingly, it is an object of the present invention to overcome the above-mentioned drawbacks of the conventional techniques by providing a semiconductor device capable of working stably by eliminating the possible interference between data while reducing the cell-occupied area.

According to the embodiment of the present invention, there is provided a semiconductor device comprising:
a support substrate;
an embedded insulating layer formed on the support substrate;
a semiconductor layer on the embedded insulating layer;
at least an element region formed in the semiconductor layer;
a plurality of source/drain regions of a first conductivity type, formed in the element region at predetermined intervals;
a plurality of body regions of a second conductivity type, sandwiched between a pair of adjacent ones of the source/drain regions in the element region; and
a gate formed on each of the body regions with a gate insulating film being laid between them,
each of the source/drain regions including:
an inner high-concentration portion extending to the embedded insulating layer, and
an outer low-concentration portion surrounding the inner high-concentration portion and having a direct contact with the body regions.

According to the embodiment of the present invention, there is provided a semiconductor device comprising:
a support substrate;
an embedded insulating layer formed on the support substrate; and
a row of element units formed on the embedded insulating layer in a first direction, the element units being isolated from each other by an isolation recess having a predetermined width along the first direction,
each of the element units including:
a pair of source/drain regions of a first conductivity type, opposite to each other along the first direction;
a body region of a second conductivity type, sandwiched between the pair of source/drain regions; and
a gate formed on the body region with a gate insulating film being laid between them, and
the width of the isolation recess being set smaller than that of the element unit itself in a second direction perpendicular to the first direction.

DETAILED DESCRIPTION OF THE INVENTION

The present invention will be described in detail below concerning the embodiments thereof with reference to the accompanying drawings.

First Embodiment

Figure 1:
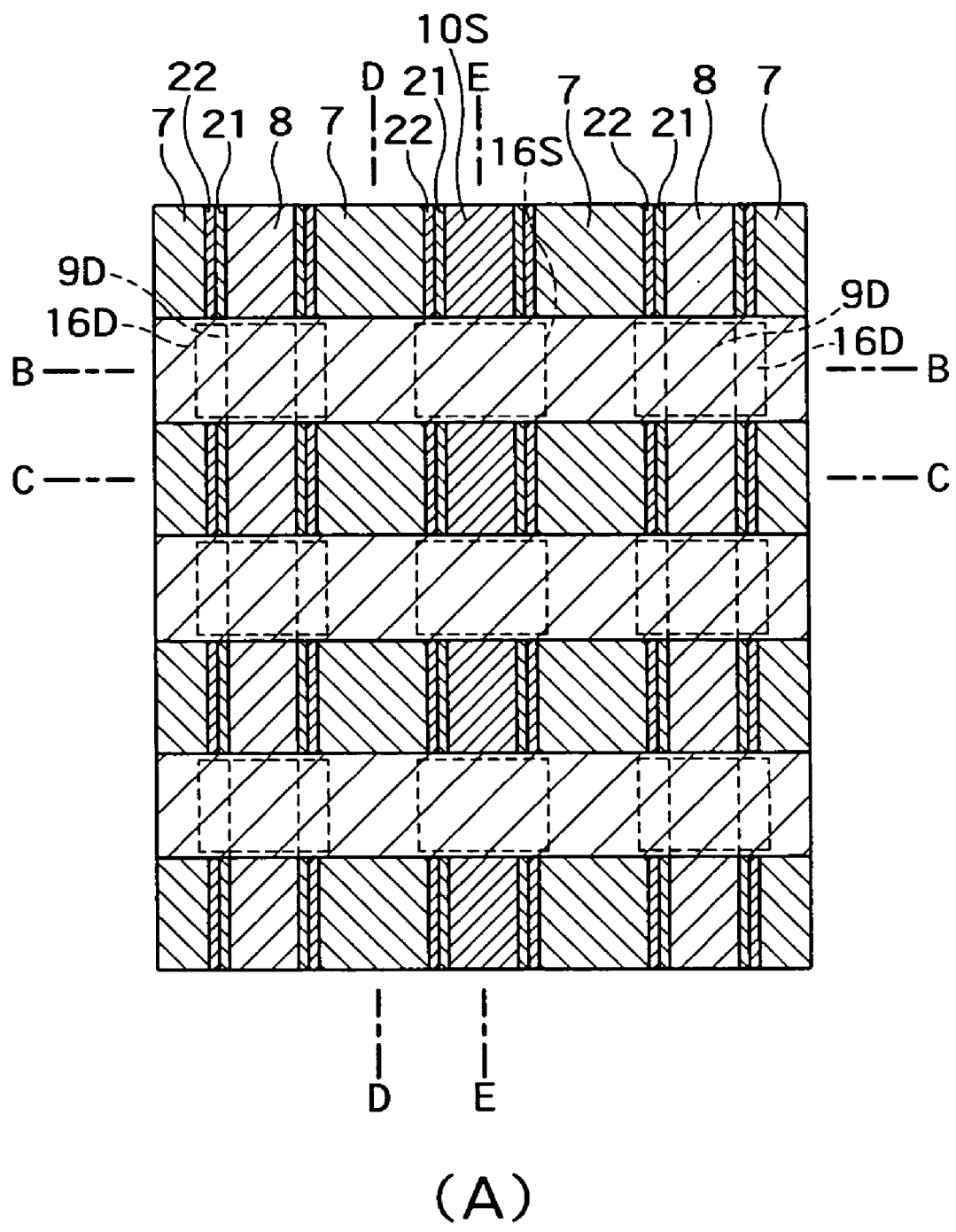
FIG. 1 is a plan view of a semiconductor device as the first embodiment of the present invention.
Figure 2:
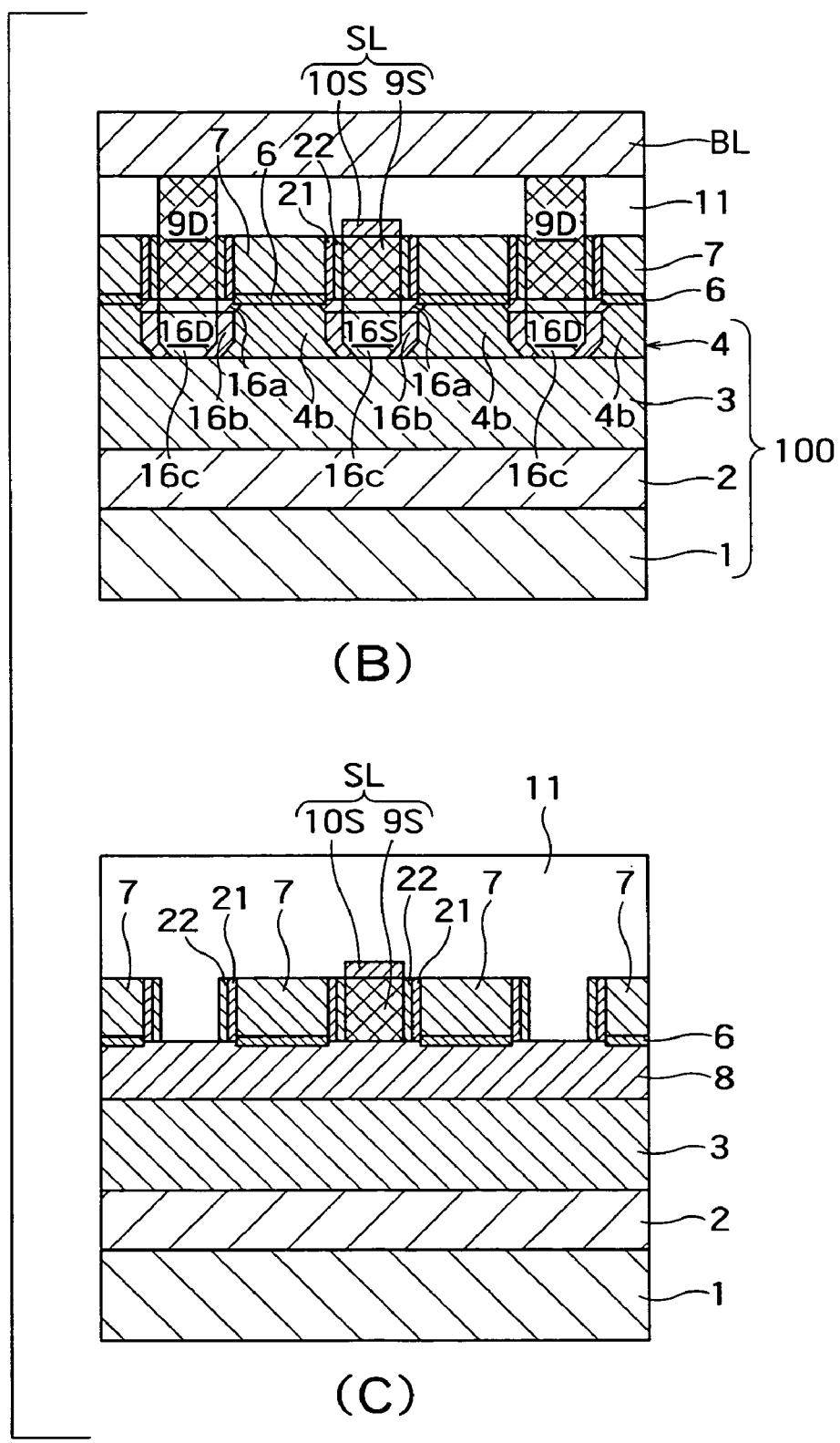
FIG. 2 shows sectional views of the semiconductor device, taken along lines B—B and C—C, respectively, in FIG. 1.
Figure 3:
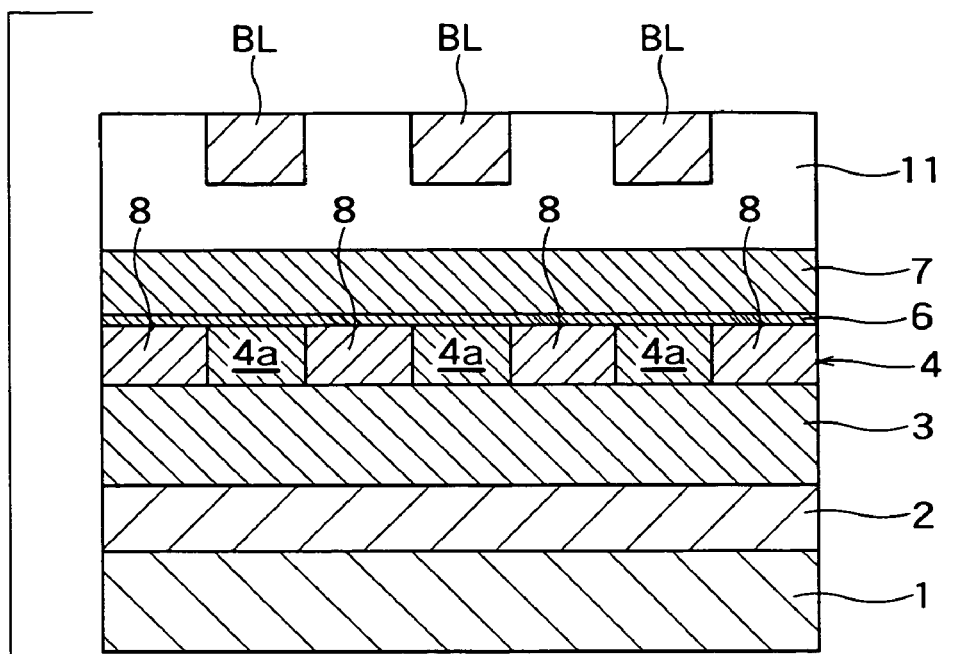
FIG. 3 shows sectional views of the semiconductor device, taken along lines D—D and E—E, respectively, in FIG. 1.
Figure 3:
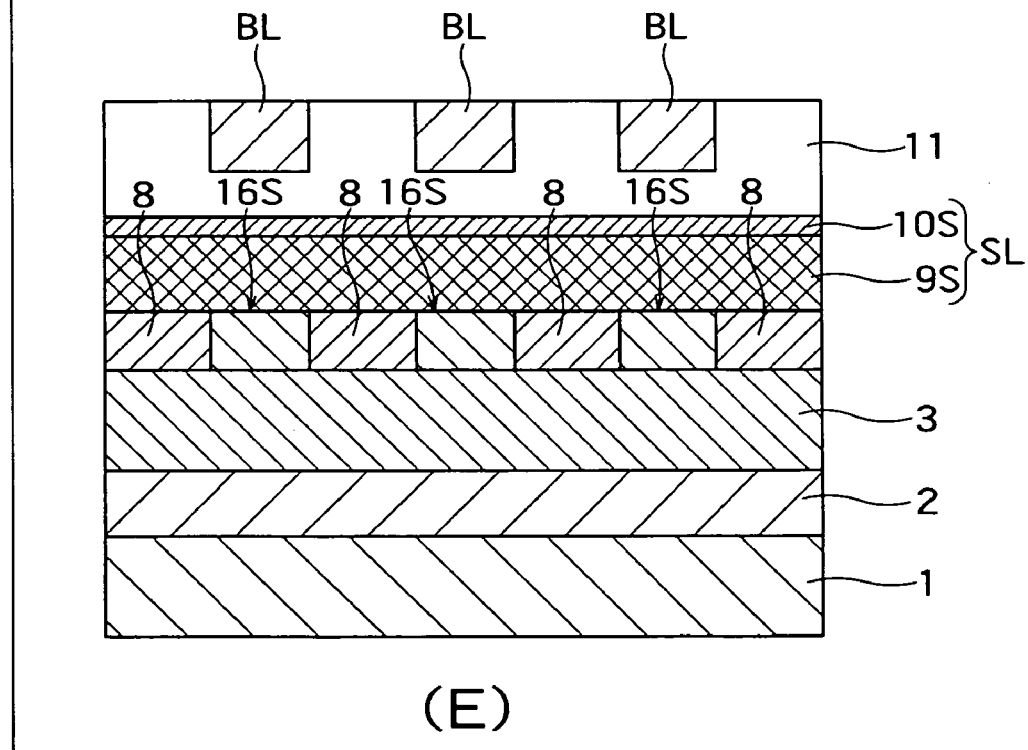

FIGS. 1 to 3 show an FBC memory as an example of the semiconductor according to the first embodiment of the present invention. FIG. 1 is a plan view of the FBC memory, FIG. 2(B) shows sectional views taken along lines B—B and C—C, respectively, in FIG. 1, FIG. 3(D) is a sectional view taken along a line D—D in FIG. 1 and FIG. 3(E) is a sectional view taken along a line E—E in FIG. 1. The embodiment in FIG. 1 is similar in basic structure to the conventional FBC memory having been described above with reference to FIGS. 22 to 25. In the following description, the same component elements as in FIGS. 22 to 25 will be indicated with the same references as in FIGS. 22 to 25 and will not be described in detail. This is also true with other embodiments of the present invention, which will be described later.

The first embodiment has one characteristic shown in FIGS. 2(B) and 2(C), for example. More particularly, each of diffusion layers 16D and 16S as source/drain regions is designed to have a double structure including an outer middle-concentration doped extension region 16a and diffusion region 16b, and an inner high-concentration doped region 16c as shown in FIG. 2(B). Further, a gate electrode side wall 22 of a nitride film is formed across a gate electrode 7 with a thin oxide film 21 being laid between them. The contact plugs 9D and 9S are formed with these gate electrode side walls 22 being laid between them. This is also true for the sectional view in FIG. 2(C).

Because of the aforementioned semiconductor device construction, the life of holes being minority carriers in the high-concentration region 16c is considerably short and thus the bipolar operation does not easily occurs between floating bodies and the N+ diffusion layer, adjacent to one another. Also, data interference will not occur between cells.

Figure 4:
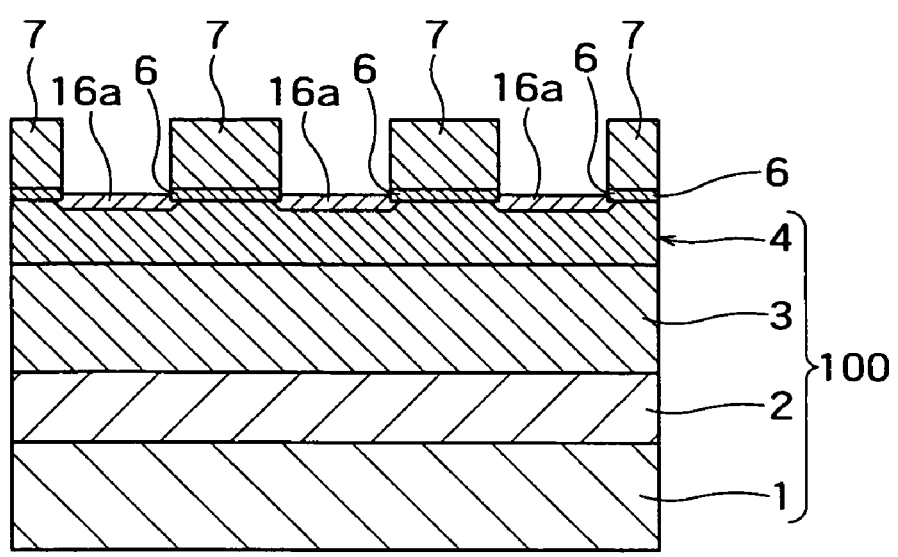
FIG. 4 shows sectional views of the semiconductor device as the first embodiment of the present invention, showing steps of the manufacturing.
Figure 4:
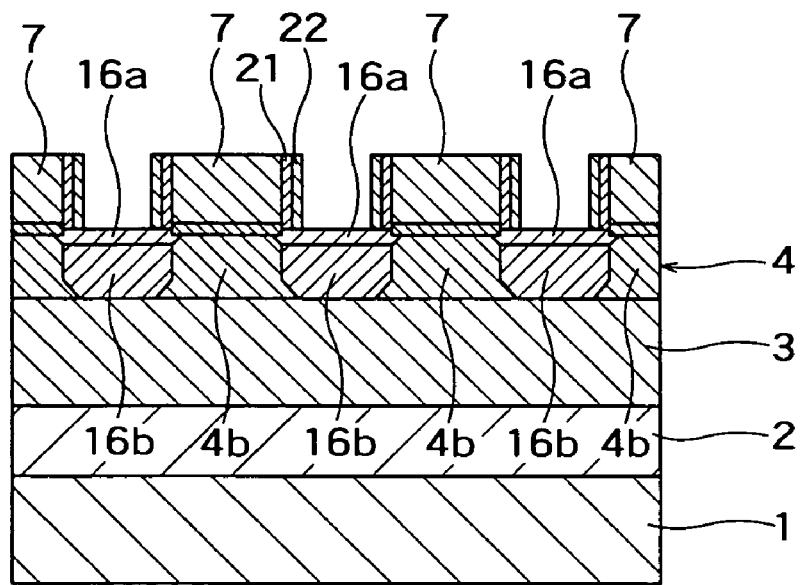
Figure 5:
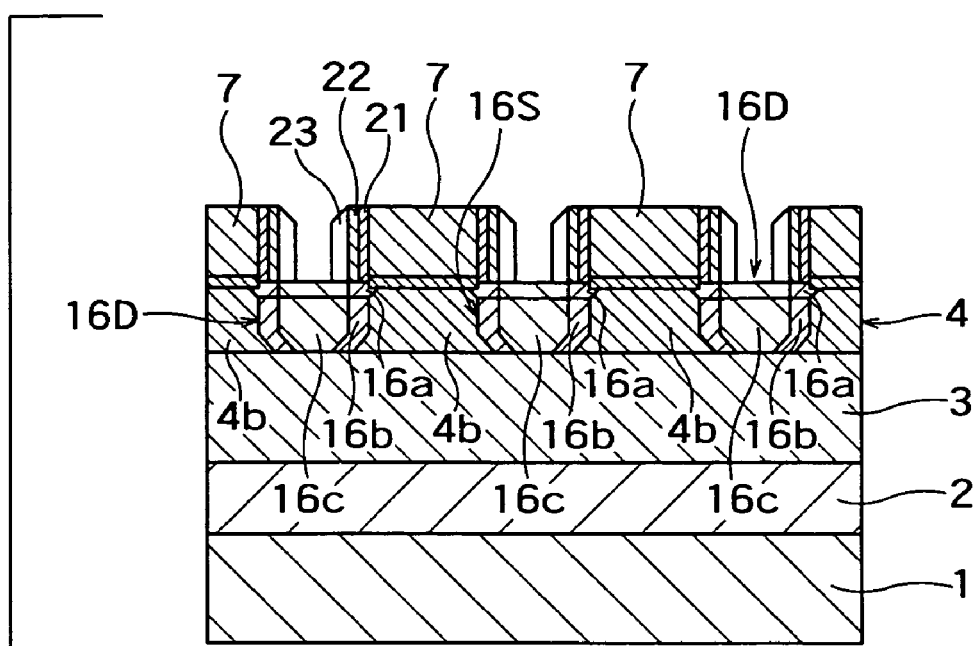
FIG. 5 shows sectional views of the semiconductor device as the first embodiment of the present invention, showing further steps of the manufacturing process.
Figure 5:
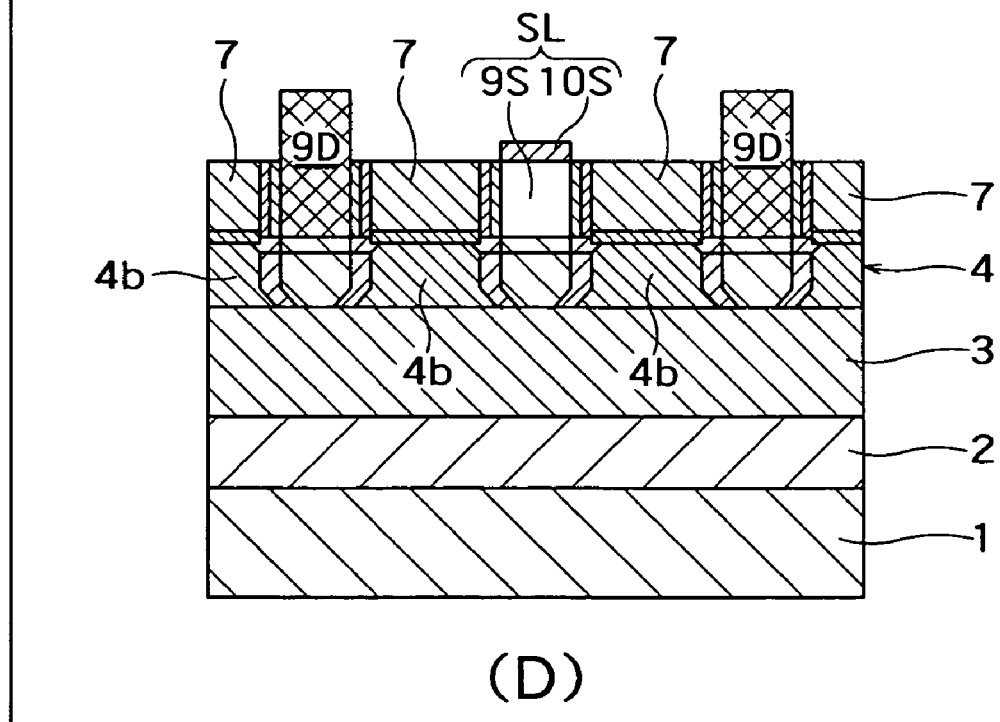

The semiconductor device constructed as above is produced as will be described in due order below with reference to FIGS. 4 and 5. FIGS. 4 and 5 show sectional views, respectively, corresponding to FIG. 2(B).

As shown in FIG. 4(A), the semiconductor device includes an SOI substrate 100 that is similar to that having previously been described with reference to FIG. 23(B). As especially shown in FIG. 25, each of the silicon layers 4 on the SOI substrate 100 is sandwiched between a pair of element isolation films 8 to form a strip extending horizontally in the plane of the drawing. The gate electrode 7 shown in FIG. 4(A) is 0.1 μm wide, for example. An N-type impurity such as P (phosphorus) is doped at 10 keV and 1E13 (cm$^{-2}$) into the silicon layer 4 via the gate electrode 7 to form the extension region 16a self-aligned with the gate electrode 7.

Next, a nitride film is deposited between the gate electrodes 7 with a thin oxide film 21 provided between them, and then the deposited nitride film is etched back by the RIE (reactive ion etching) method to form a gate electrode side wall 22 of some 20 nm in thickness on the gate electrode 7, as shown in FIG. 4(B).

Further, an N-type impurity such as P (phosphorus) is doped at 10 keV and 3E13 (cm$^{-2}$) into the silicon layer 4 via the gate electrode 7 and then P (phosphorus) for example is doped into the into the silicon layer 4 at 60 keV and 3E13 (cm$^{-2}$) to form a diffusion region 16b which is self-aligned with the gate electrode 7, extending to the embedded oxide film 3.

Next, a TEOS (tetraethoxysilane) film is deposited by the CVD method, and the deposited TEOS film is etched back by the RIE method to form a TEOS side wall 23 of about 20 nm in thickness, as shown in FIG. 5(C). Then, an N-type impurity such as As (arsenic) is doped into the silicon layer 4 at 180 keV and 5E13 (cm$^{-2}$) to form a high-concentration region 16c.

Then, the contact plugs 9S and 9D are finally formed by depositing a TEOS film by the CVD method, flattening the top of the film, forming an opening in the film by the lithography and etching, and embedding a phosphorus-added polysilicon, as shown in FIG. 5(D). A metal line 10S is formed on the contact plug 9S to provide a 2-layer type source line SL. Also, a bit line BL is connected to the contact plug 9D as shown in FIG. 2(B).

As having previously been mentioned, since the life of holes will be considerably short in the high-concentration region 16c, it is possible to inhibit the bipolar operation from taking place among floating bodies (silicon region 4b) and N+ diffusion region (diffusion region 16S), adjacent to one another, and thus suppress the data interference between cells.

Also, the high-concentration region 16c and charge-storage, P-type floating body (silicon region 4b) are isolated from each other by middle-concentration impurity-doped regions (16a, 16b), which permits to suppress junction leakage. Thus, the semiconductor device can work stably as a memory.

According to this embodiment, P (phosphorus) is doped into the extension region 16a and diffusion region 16b, both being outer regions, and As (arsenic) is into the high-concentration region 16c. The As atom is larger in mass than the P atom, and slower in velocity of lateral diffusion. Thus, the high-concentration region 16c surrounded by the regions 16a and 16b can be formed with a high controllability. Also, the As atom having a larger mass is apt to cause more defects in the silicon layer than the P atom, and thus capable of shortening the life of the minority carriers. Namely, it is more effective to inhibit the bipolar operation, and contributes to a stabler operation of the semiconductor device. It should be noted that to attain such an object, As (arsenic) may be replaced with Sb (antimony) as the impurity for doping into the high-concentration region 16c, which will result in a greater effect. In addition, doping As into the outer regions 16a and 16d while doping Sb into the high-concentration region 16c will also provide a similar effect.

Further, for contact of the contact plugs 9S and 9D formed from polysilicon with the source/drain regions 16S and 16D, respectively, the high-concentration region 16c can effectively reduce the contact resistance, which enables the semiconductor device to work more speedily.

Also, an IV-family element heavier than Si, such as Ge, may be used, rather than the above-mentioned As or Sb, as the impurity for doping into the high-concentration region 16c. Also in this case, an amorphous region develops in the Si substrate and can shorten the life of the minority carriers, and effectively inhibit the bipolar operation while suppressing the junction leakage.

Second Embodiment

Figure 6:
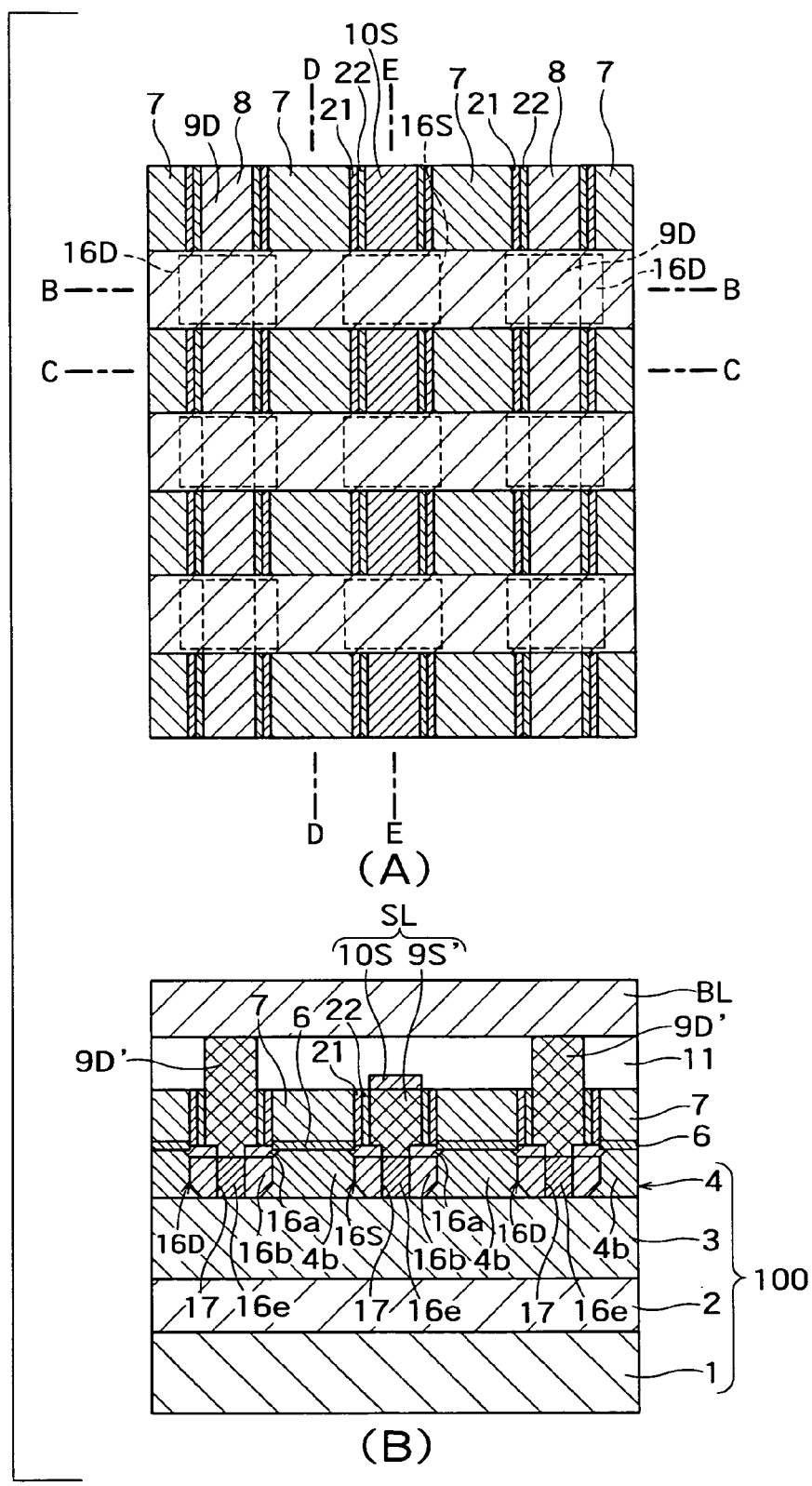
FIG. 6 shows a plan view of a semiconductor device as the second embodiment of the present invention, and also a sectional view of the semiconductor device, taken along a line B—B in the plan view.
Figure 7:
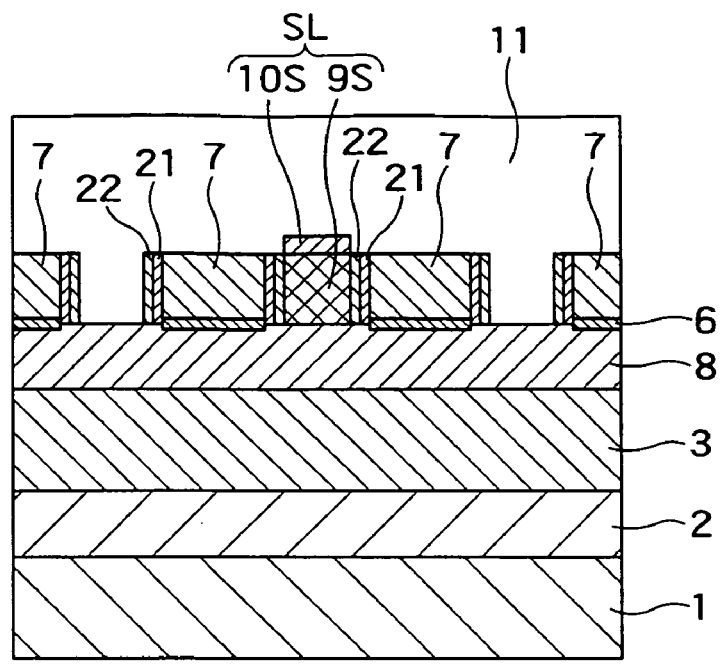
FIG. 7 shows sectional views of the semiconductor device, taken along lines C—C and D—D, respectively, in FIG. 6.
Figure 7:
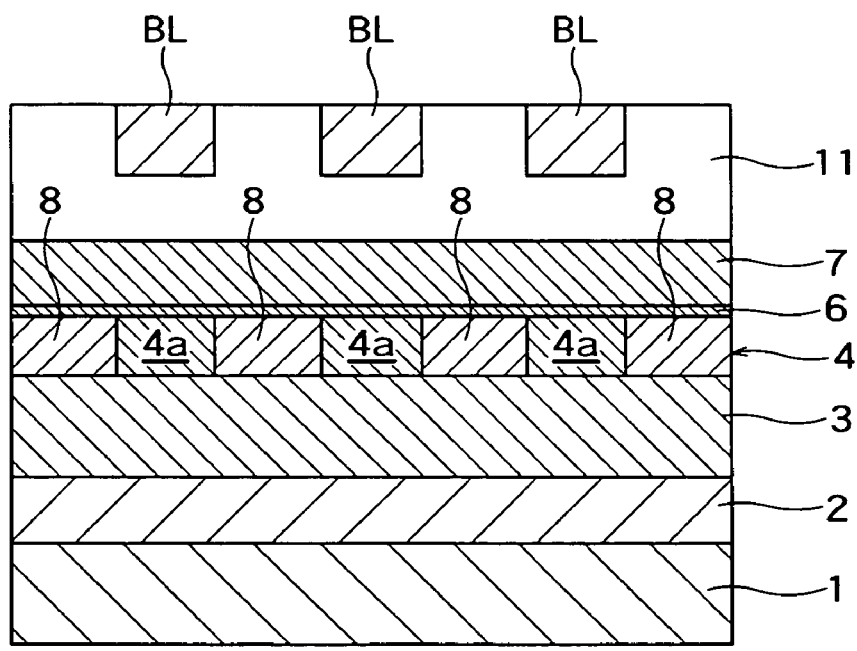
Figure 8:
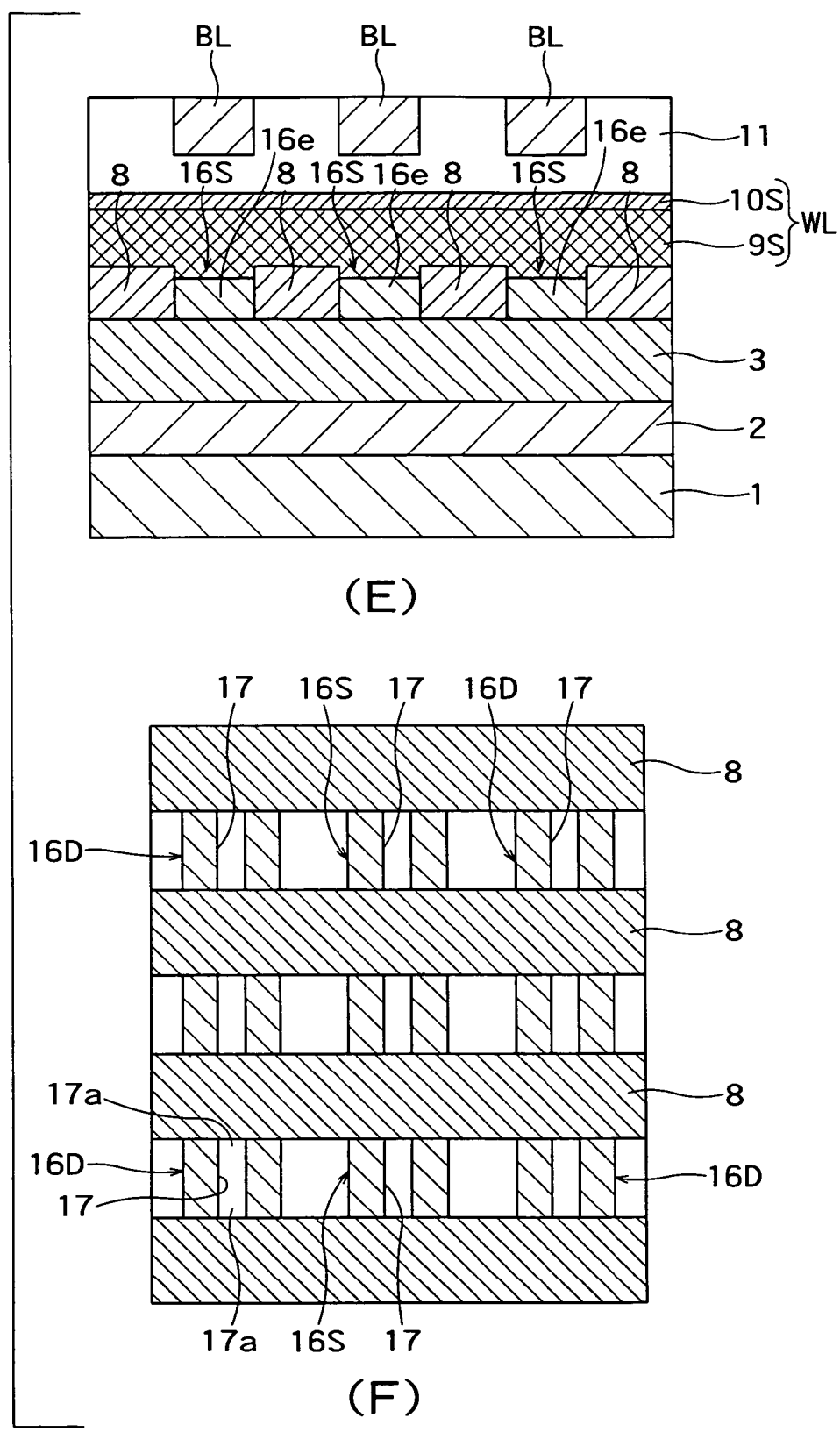
FIG. 8 shows a sectional view of the semiconductor device, taken along a line E—E in FIG. 6, and also a plan view of the semiconductor device, showing the physical relationship between the element isolation films and element units.

FIGS. 6 to 8 show together an FBC memory as a semiconductor device according to the second embodiment of the present invention, in which FIG. 6(A) is a plan view of the semiconductor, FIG. 6(B) is a sectional view taken along a line B—B in FIG. 6(A), FIG. 7(C) is a sectional view taken along lines C—C in FIG. 6(A), FIG. 7(D) is a sectional view taken along a line D—D in FIG. 6(A), FIG. 8(E) is a sectional view taken along a line E—E in FIG. 6(A), and FIG. 8(F) is a plan view of the semiconductor device with some portions omitted.

As especially shown in FIG. 6(B), in the semiconductor device as the second embodiment of the present invention, the element regions in two cells adjacent to each other horizontally in the plane of the drawing are isolated from each other by an anti-interference isolation recess 17 formed in the diffusion layers 16S and 16D each as a source/drain region. Thus, the bipolar operation does not easily occur between horizontally adjacent floating bodies (P-type silicon region 4b) and the N$^+$ diffusion layer 16S, adjacent to one another. Hence, the problem of data interference between the cells can be solved.

Figure 9:
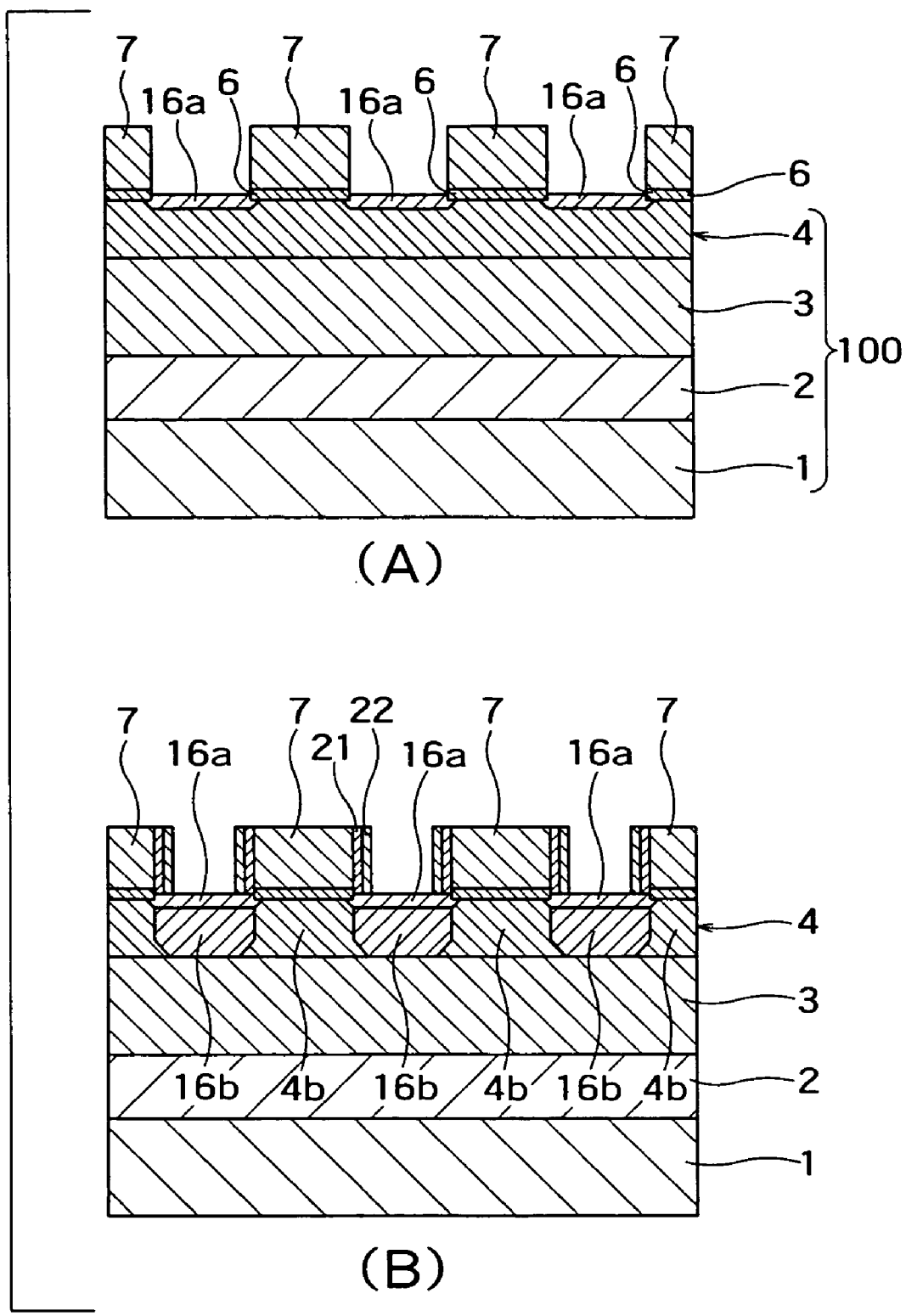
FIG. 9 shows sectional views of the semiconductor device as the second embodiment of the present invention, showing steps of the manufacturing process.
Figure 10:
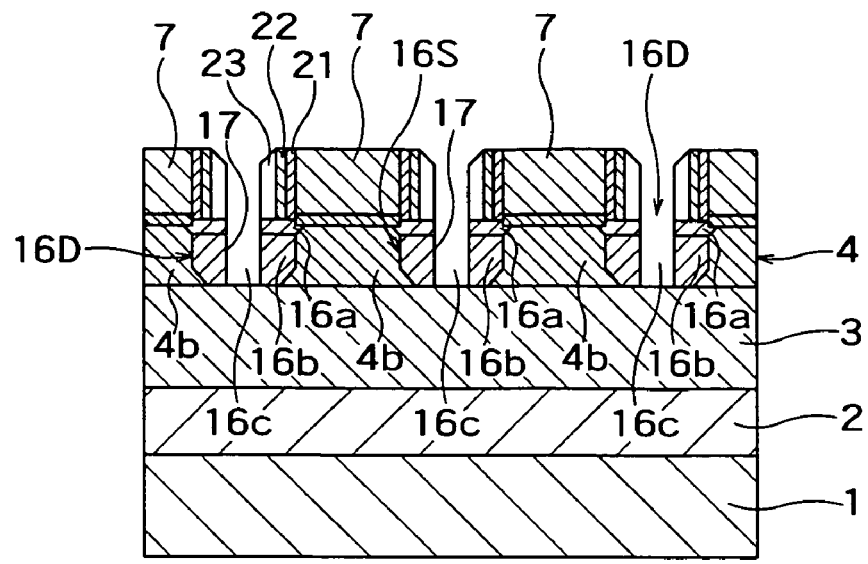
FIG. 10 is a sectional view of the semiconductor device as the second embodiment of the present invention, showing a step of the manufacturing process.
Figure 11:
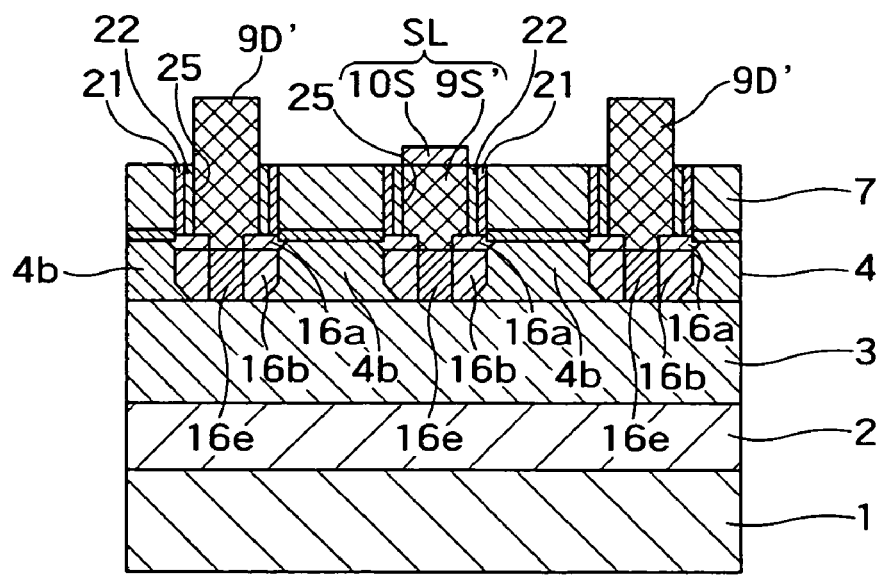
FIG. 11 is a sectional view of the semiconductor device as the second embodiment of the present invention, showing another step of the manufacturing process.

The semiconductor device constructed as above is produced as will be described in due order below with reference to FIGS. 9 to 11 being process step-illustrating sectional views, respectively, corresponding to FIG. 6(B).

The process steps shown in FIGS. 9(A) and 9(B) are identical to those shown in FIGS. 2(A) and 2(B).

As shown in FIG. 10(C), a TEOS film is deposited by the CVD method, and etched back by the RIE method. Thus, a TEOS side wall 23 is formed. The TEOS side wall is 20 nm or so in thickness, for example. Further, the extension region 16a and the diffusion region 16b are selectively etched by RIE method through the space surrounded by the TEOS side wall 23 to open the anti-interference isolation recess 17 which is formed as self-aligned with the side wall 23.

Next, a TEOS film 16e is deposited in the anti-interference isolation recess 17 and on the upper recess portion by the CVD method as shown in FIG. 11(D). The upper portion of the TEOS film 16e is flattened to the same level as a gate electrode 7. Thereafter, an opening 25 is formed between the gate electrodes 22 by the lithography and etching in such a manner that it has a bottom at a level lower than the upper surface of the extension region 16a. A phosphorus-added polysilicon is embedded in these openings 25 to form contact plugs 9S' and 9D'.

Generally in the data-storage floating body, the level of the boundary between the element isolation regions (source/drain regions) is lowered. To this end, the process of forming the element isolation region should preferably include a step of a high-temperature heat treatment at a high temperature. On the contrary, in case the element isolation regions (source/drain regions) are formed as self-aligned with the gate electrode, the high-temperature heat treatment is undesirable because it will considerably vary the impurity distribution near the gate electrode.

According to the second embodiment of the present invention, the floating body region (silicon layer 4b) is sandwiched horizontally between the element isolation films 8 formed before the gate electrode 7 is formed (see FIGS. 7(D), 7(E) and 8(F)) and diffusion layers 16S and 16D each as a source/drain region as shown in FIG. 6(A). The anti-interference isolation recess 17 is not in any direct contact with the floating body region (silicon region 4b) and is isolated from the latter. So, it will not increase the boundary level. Thus, there can be implemented a semiconductor device capable of working stably without any problem of the data interference.

Also, according to the second embodiment of the present invention, the minimum working dimension of the lithography is on the order of 0.1 μm and the gate electrode 10 and element region are about 0.1 μm thick. With these dimensions, the anti-interference isolation recess 17 is 20 nm or so in width which is less than a half of the minimum working dimension. Namely, the recess 16 has a form of a very fine slit. Thus, a semiconductor device capable of working stable can be implemented without increase of the cell-occupied area.

Note that although the anti-interference isolation recess 17 is small in width, adjacent diffusion layers 16b across the TEOS film are electrically connected by the contact plugs 9D' and 9S' so that they will always be at the same potential. Thus, no problem of dielectric breakdown will take place in this semiconductor device. Therefore, the insulating film embedded in the anti-interference isolation recess 17 may be formed from any other insulating film such as a silicon oxide film, silicon nitride film or the like in addition to the aforementioned TEOS film.

Also as will be seen from FIG. 6(B), according to the second embodiment, a TEOS film is embedded once in the anti-interference isolation recess 17, and then is subjected to a so-called over-etching at the time of forming a contact plug 15. With this over-etching, the upper surface of the TEOS film 16e is slightly etched away to a depth generally equivalent to the thickness of the extension region 16a. Thereby, the surface of the contact plugs 9S' and 9D', that is in contact with the SOI substrate, spreads from only the bottom of the contact plugs 9S' and 9D' to the side as well. Thus, the contact resistance can be reduced, which contributes to an improved speed of operation of the semiconductor device.

Also, an extremely thin insulating film may be interposed between the contact plugs 9D' and 9S' and the element regions (diffusion regions 16a, 16b) to prevent the material of the contact plugs from diffusing to the element regions during production of the semiconductor device. Thus, it is possible to prevent the junction leakage from being deteriorated and implement a semiconductor device excellent in data storage characteristic.

Figure 12:
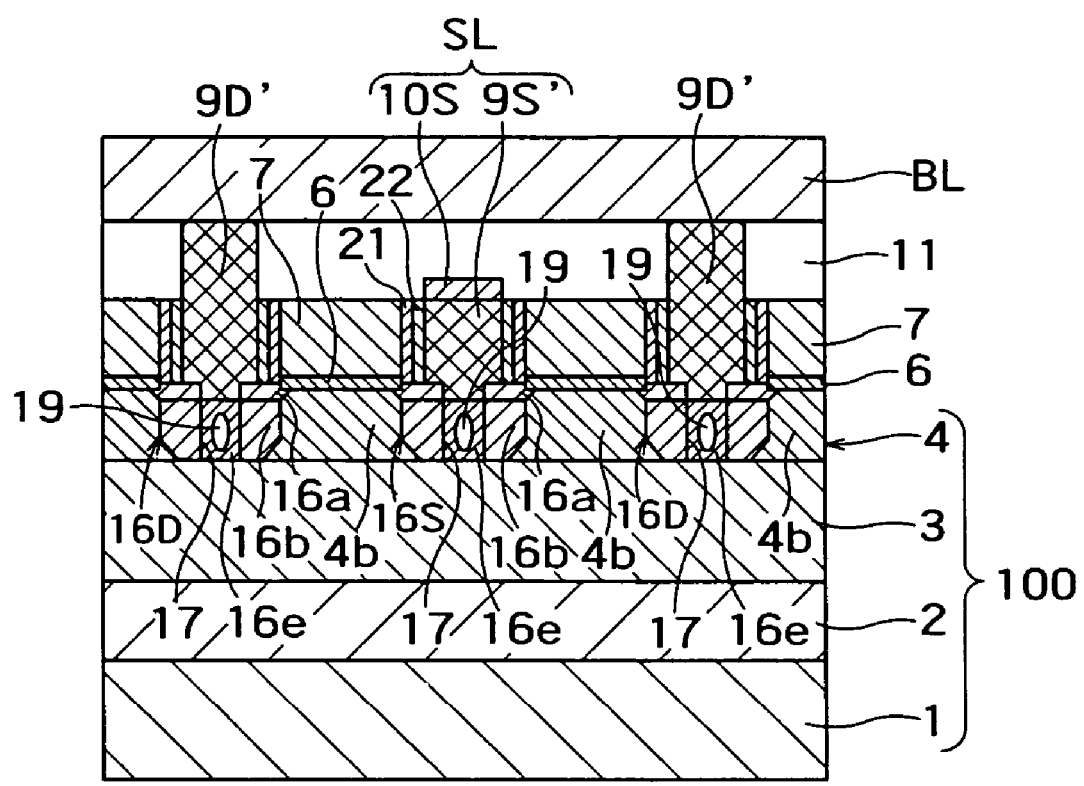
FIG. 12 is a sectional view of a semiconductor device as a first variant of the second embodiment of the present invention, taken along a bit line.

FIG. 12 is a sectional view of the semiconductor device as a first variant of the second embodiment of the present invention. This semiconductor device in FIG. 5 differs in construction from that shown in FIG. 6(B) in that a cavity 19 is left within the TEOS film 16e embedded in the anti-interference isolation recess 17.

Because of the construction of the semiconductor device in FIG. 12, the mechanical stress between the element regions can be reduced to attain a stabler operation of the semiconductor device.

Figure 13:
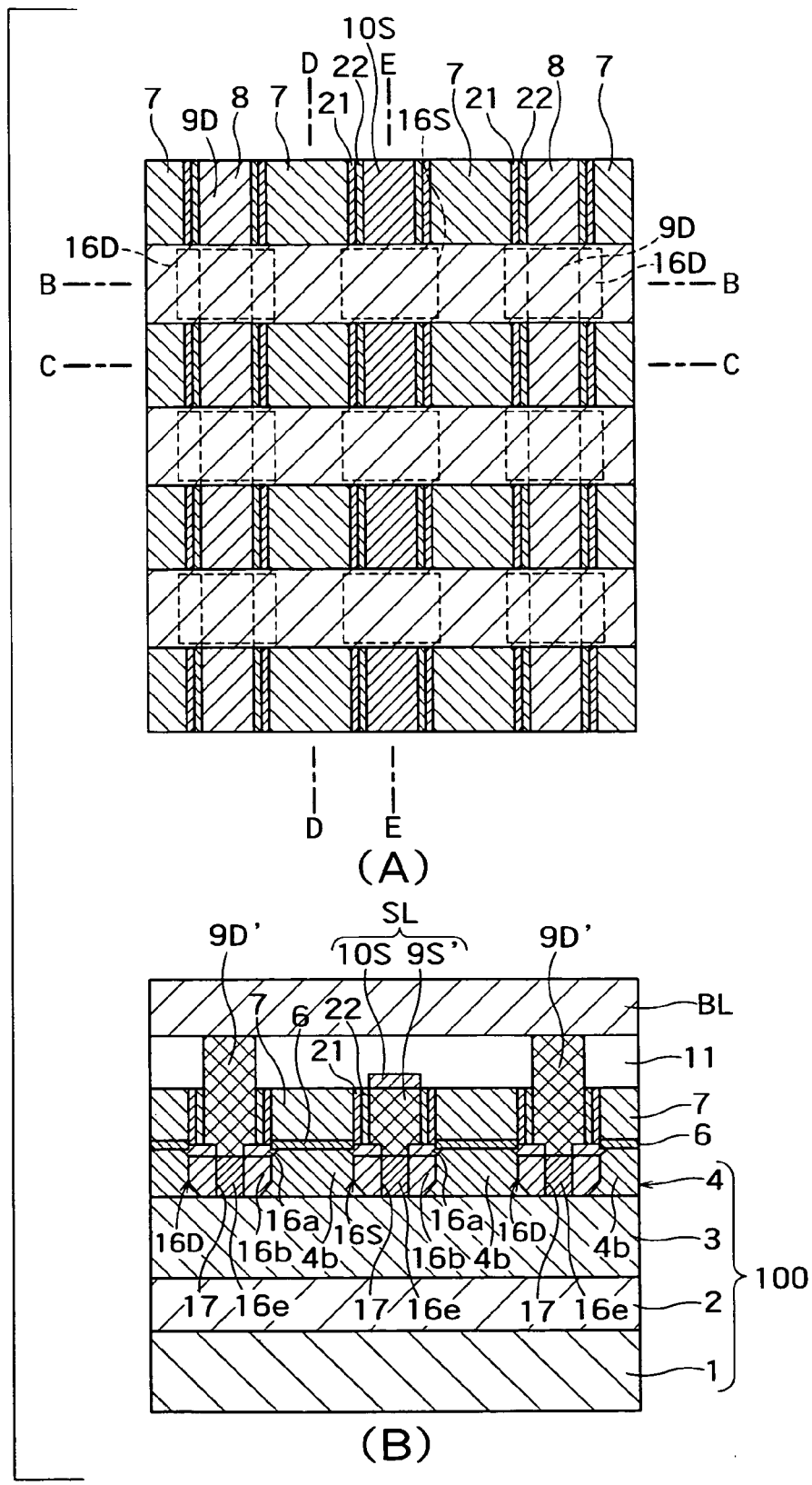
FIG. 13 shows a plan view a semiconductor device as a second variant of the second embodiment of the present invention, and also a sectional view of the semiconductor device, taken along a line B—B in the plan view.
Figure 14:
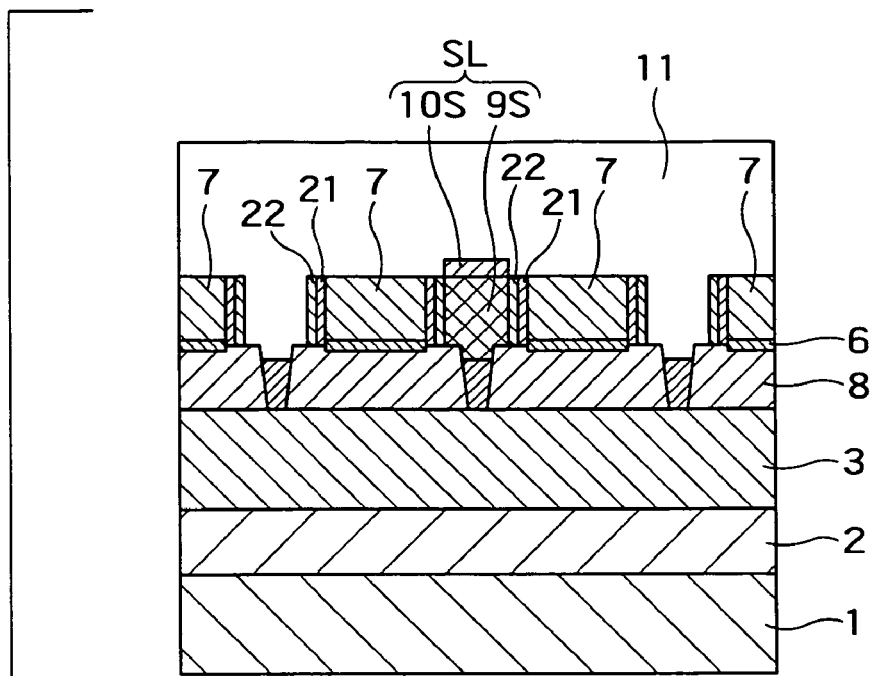
FIG. 14 shows sectional views of the semiconductor, taken along lines C—C and D—D, respectively, in FIG. 13.
Figure 14:
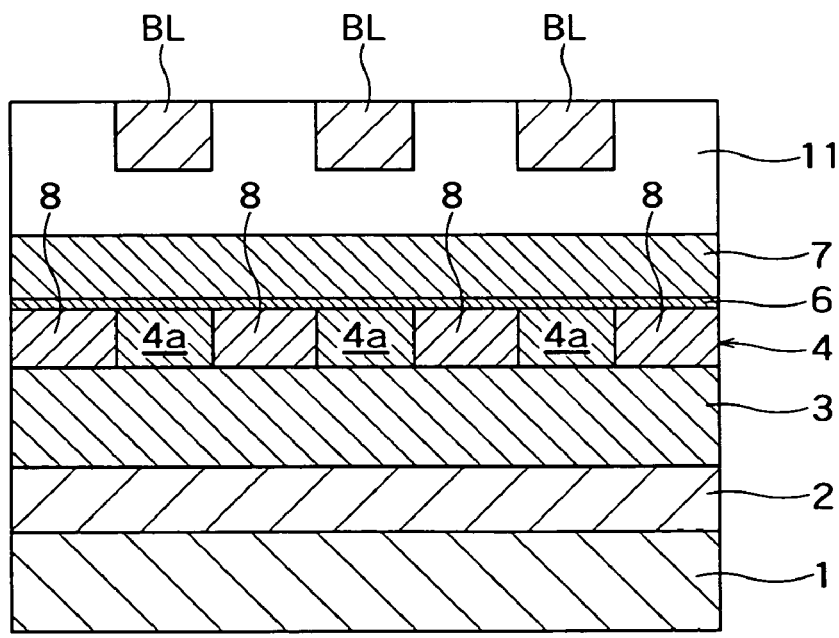
Figure 15:
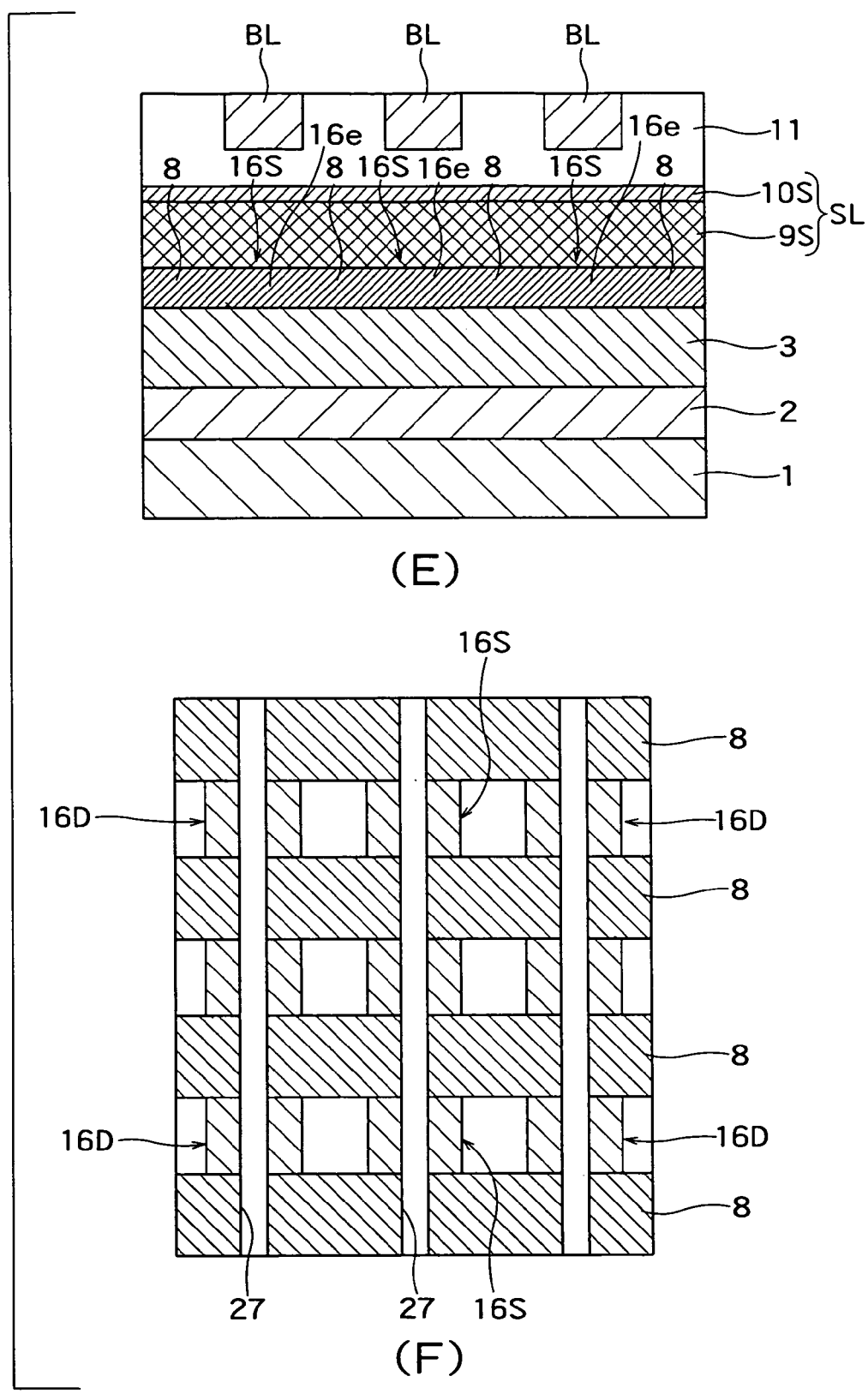
FIG. 15 shows a sectional view of the semiconductor device, taken along a line E—E in FIG. 13, and also a plan view of the semiconductor device, showing a physical relationship among the element isolation films, element units and recesses between them.

FIGS. 13 to 15 show together a semiconductor device as another variant of the second embodiment of the present invention. FIG. 13(B) is a sectional view of the semiconductor device, taken along a line B—B in FIG. 13(A), FIG. 14(C) is a sectional view taken along a line C—C in FIG. 13(A), FIG. 14(D) is a sectional view taken along a line D—D in FIG. 13(A), FIG. 15(E) is a sectional taken along a line E—E in FIG. 13(A), and FIG. 15(F) is a plan view of the semiconductor device with a part of the latter omitted.

The differences of the semiconductor device from that in FIGS. 6 to 8 are shown in FIGS. 14(C), 15(E) and 15(F). In the variant of the semiconductor device, continuous anti-interference isolation recesses 27 are formed correspondingly to the anti-interference isolation recess 17 in the semiconductor device shown in FIGS. 6 to 8. The anti-interference isolation recess 17 in the semiconductor device in FIGS. 6 to 8 is shown only in the sectional view in FIG. 6(B) and the plan view in FIG. 8(F). This means that the anti-interference isolation recess 17 is formed only in the diffusion regions 16S and 16D being source/drain regions. On the contrary, in the semiconductor device shown in FIGS. 13 to 15, the continuous anti-interference isolation recesses 27 extend continuously and vertically in FIG. 15(F) as especially shown in FIGS. 14(C) and 15(F). Naturally, element isolation films 8 are discontinued by the continuous anti-interference isolation recesses 27, which can be implemented by simultaneous etching of the silicon oxide films without use of the selective RIE method for the silicon oxide film in the step shown in FIG. 10(D) for example. As will be seen from FIG. 8(E), if it is tried to form the anti-interference isolation recess 17 in the diffusion layers 16S and 16D alone by the selective RIE method for the silicon oxide film, non-etched portions will possibly remain especially at upper and lower ends 17*a* of the anti-interference isolation recess 17. In this semiconductor device, however, any non-etched portions will not remain above, and the continuous anti-interference isolation recesses 27 can be appropriately corrected to isolate the element regions from each other more positively.

Figure 16:
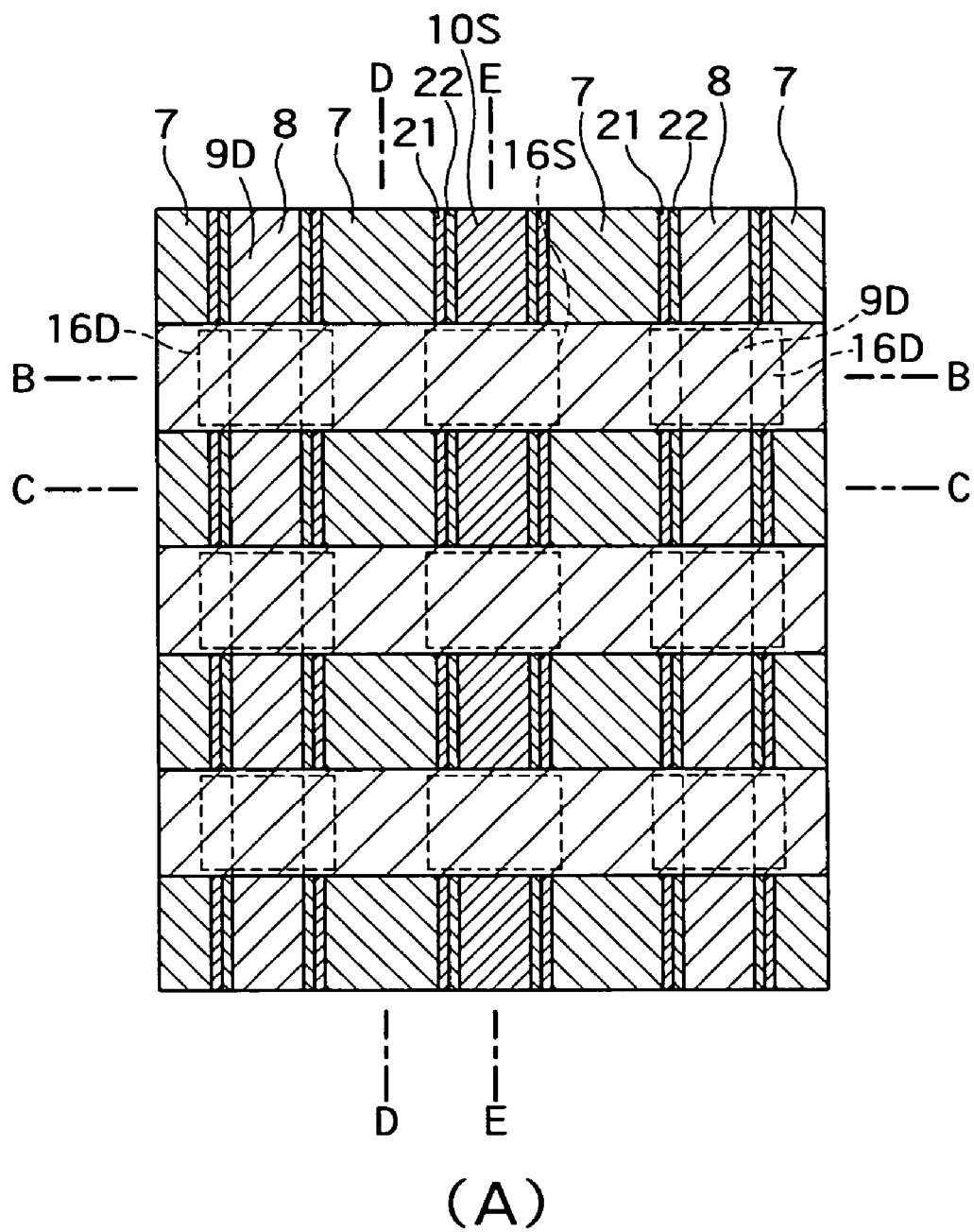
FIG. 16 is a plan view of a semiconductor device as another variant of the second embodiment of the present invention.
Figure 17:
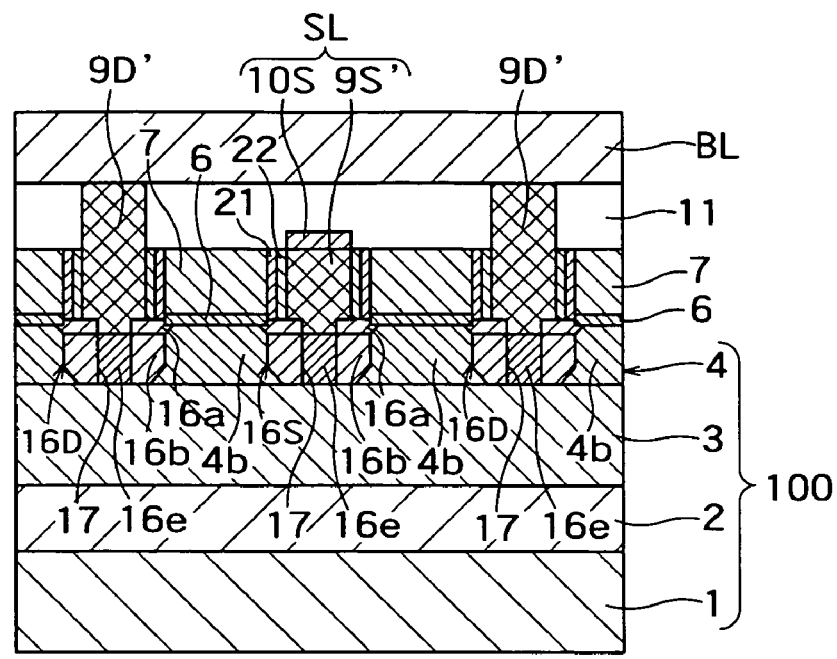
FIG. 17 shows sectional views of the semiconductor device, taken along lines B—B and C—C, respectively, in FIG. 16.
Figure 17:
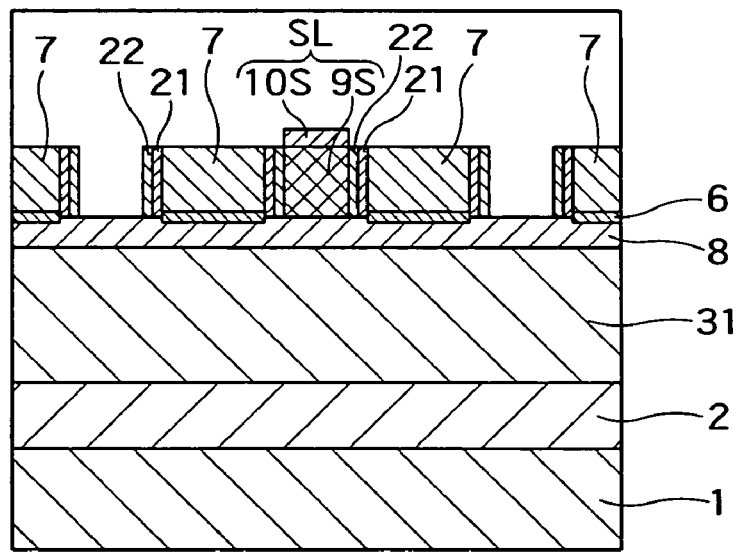
Figure 18:
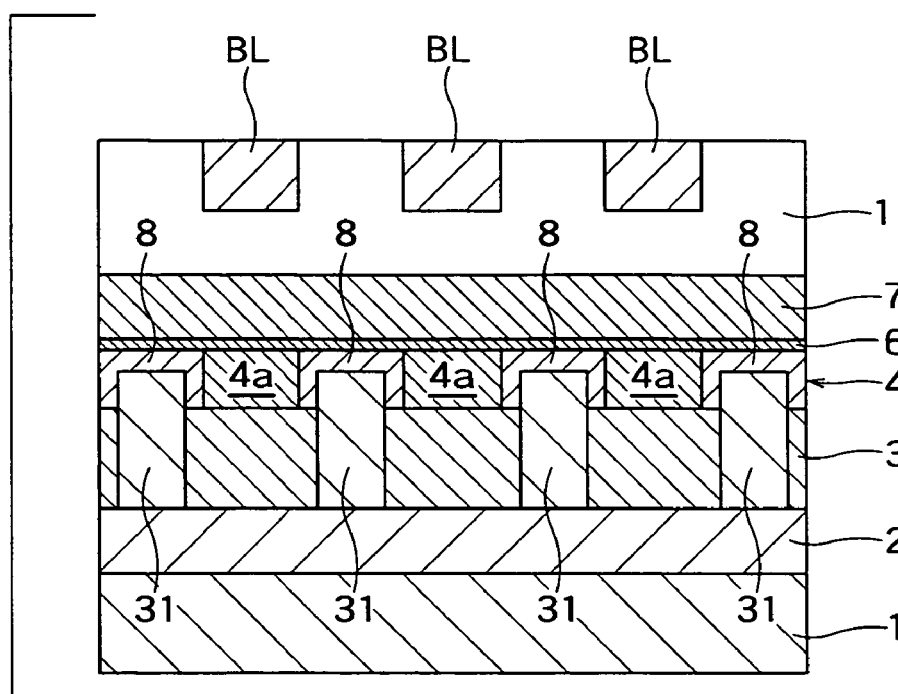
FIG. 18 shows sectional views of the semiconductor device, taken along lines D—D and E—E, respectively, in FIG. 16.
Figure 18:
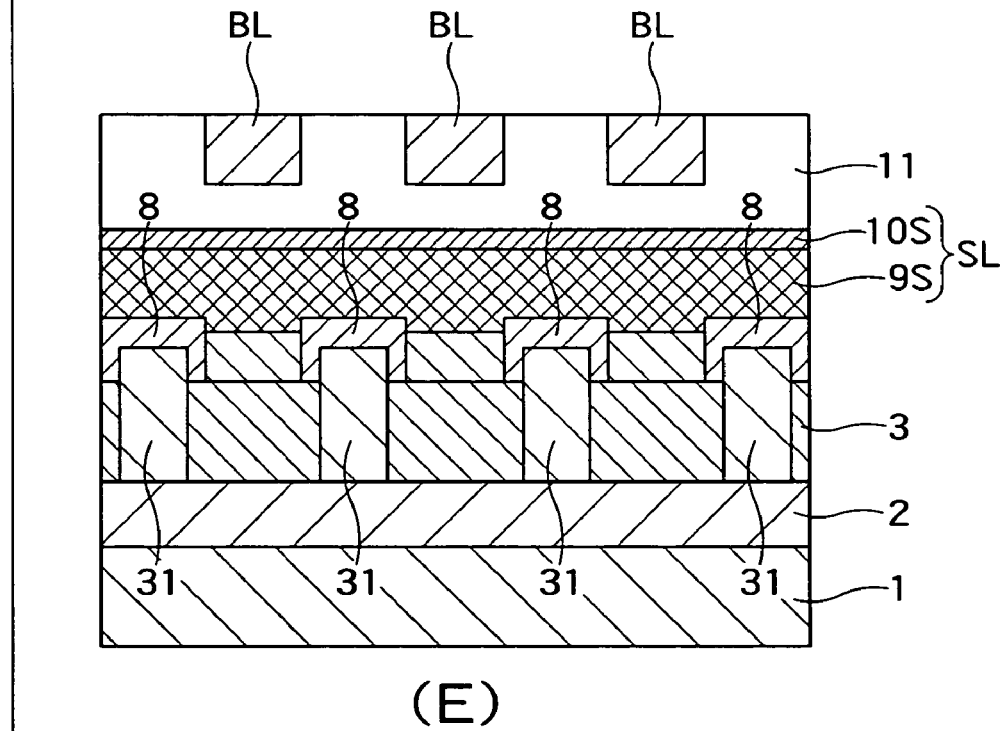

FIGS. 16 to 18 show together an FBC memory as a still another variant of the semiconductor according to the second embodiment of the present invention, shown in FIGS. 6 to 8. FIG. 16(A) is a plan view of the semiconductor device, FIG. 17(B) is a sectional view taken along a line B—B in FIG. 16(A), FIG. 17(C) is a sectional view taken along a line C—C in FIG. 17(B), FIG. 18(D) is a sectional view taken along a line D—D in FIG. 16(A), and FIG. 18(E) is a sectional view taken along a line E—E in FIG. 16(A).

Comparison of FIGS. 7(C) to 8(E) with FIGS. 17(C) to 18(E) will reveal the differences of this variant from the second embodiment shown in FIGS. 6 to 8. That is, in the semiconductor device according to this variant, the element isolation region is made as a lamination (three-layer structure) of an embedded oxide film 3, polysilicon film 31 and element isolation film 8. As shown in FIG. 16(A), the polysilicon film 31 is formed to extend like a strip horizontally in the plane of the drawing.

Because of the above construction, the floating body portion (element region 4*a*) of the element region can be capacitive-coupled to the polysilicon film 31, which permits to increase the signal amount during reading.

Figure 19:
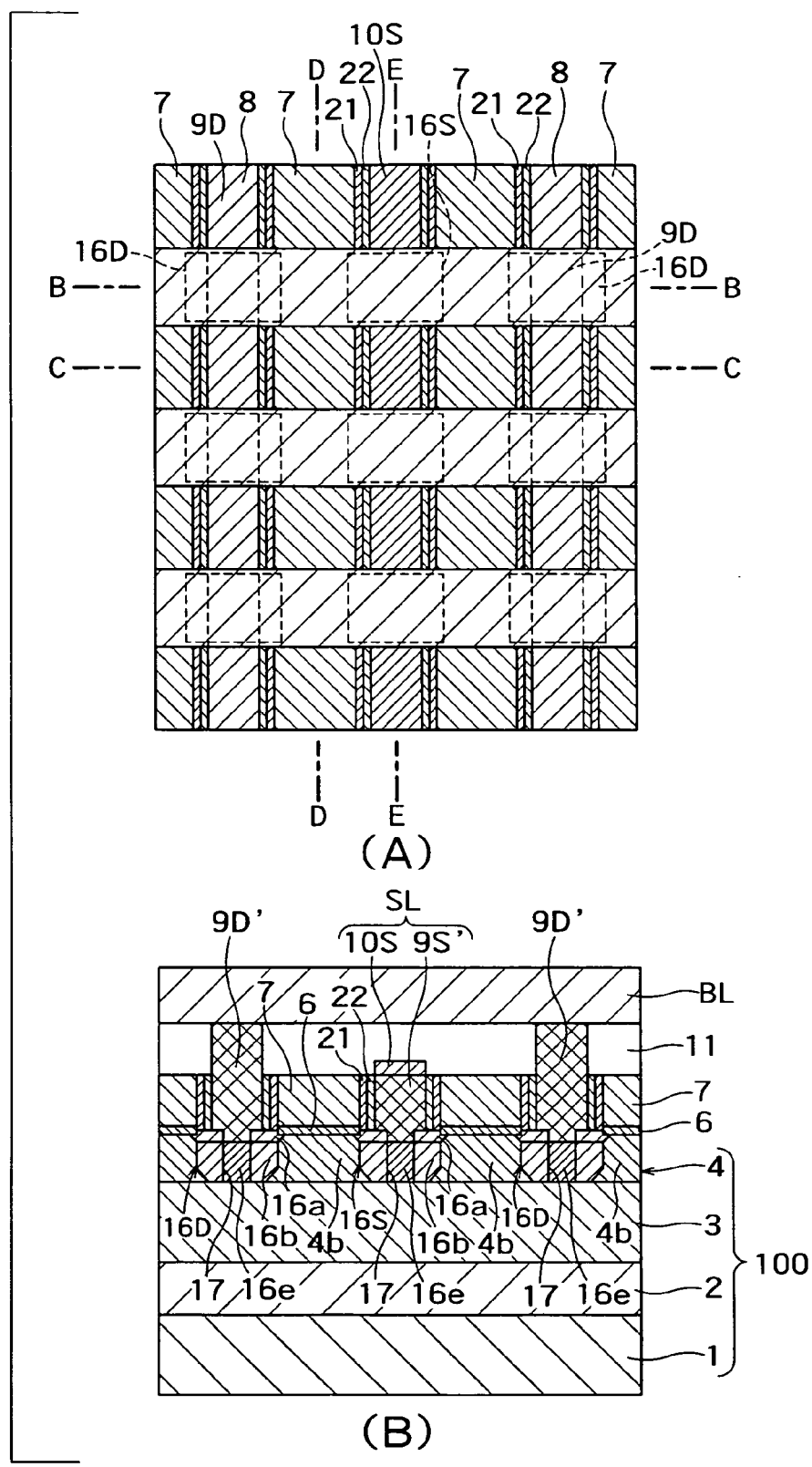
FIG. 19 shows a plan view of a semiconductor device as a still another variant of the second embodiment of the present invention, and also a sectional view of the semiconductor device, taken along a line B—B in the plan view.
Figure 20:
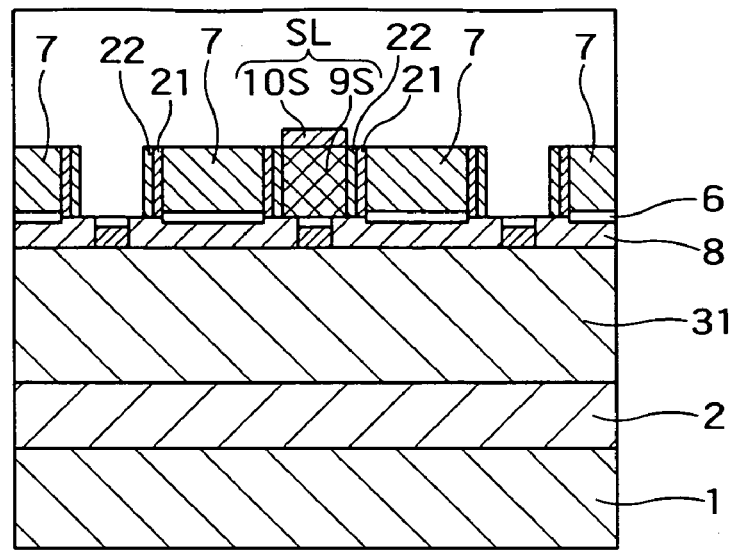
FIG. 20 shows sectional views of the semiconductor device, taken along liens C—C and D—D, respectively, in FIG. 19.
Figure 20:
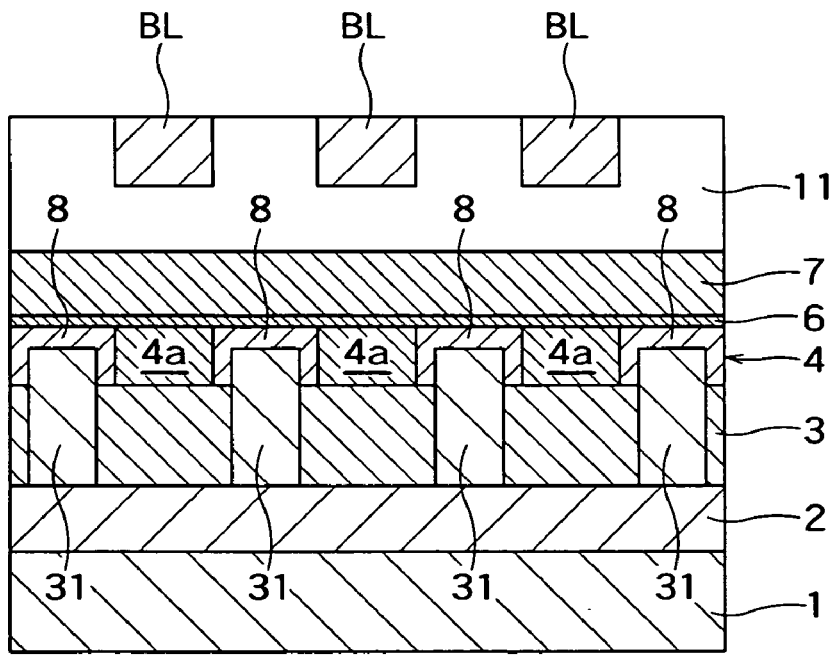
Figure 21:
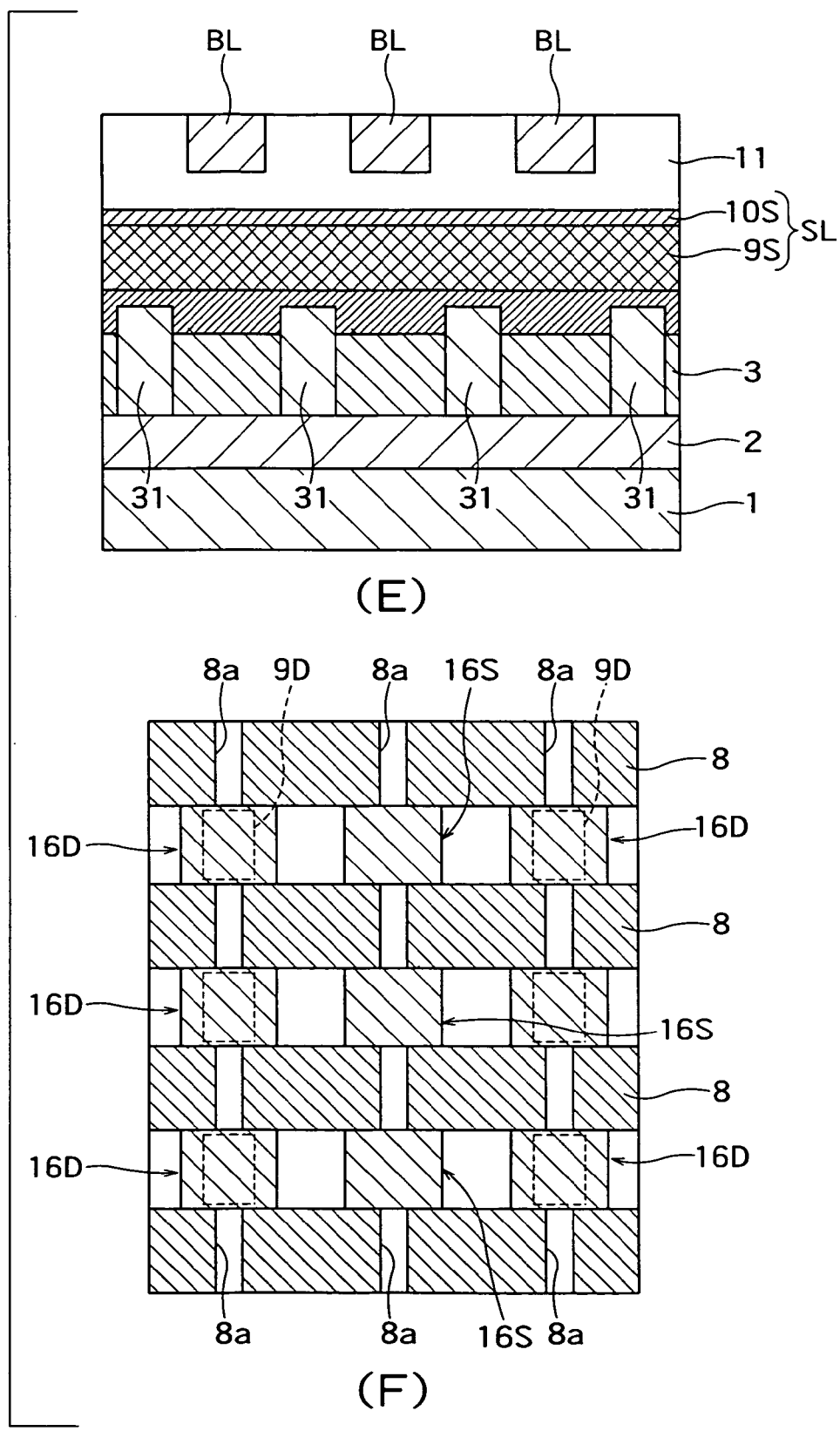
FIG. 21 shows a sectional view of the semiconductor device, taken along a line E—E in FIG. 19, and also a plan view of the semiconductor device, showing a physical relationship among the element isolation films, element units and recesses between them.
Figure 22:
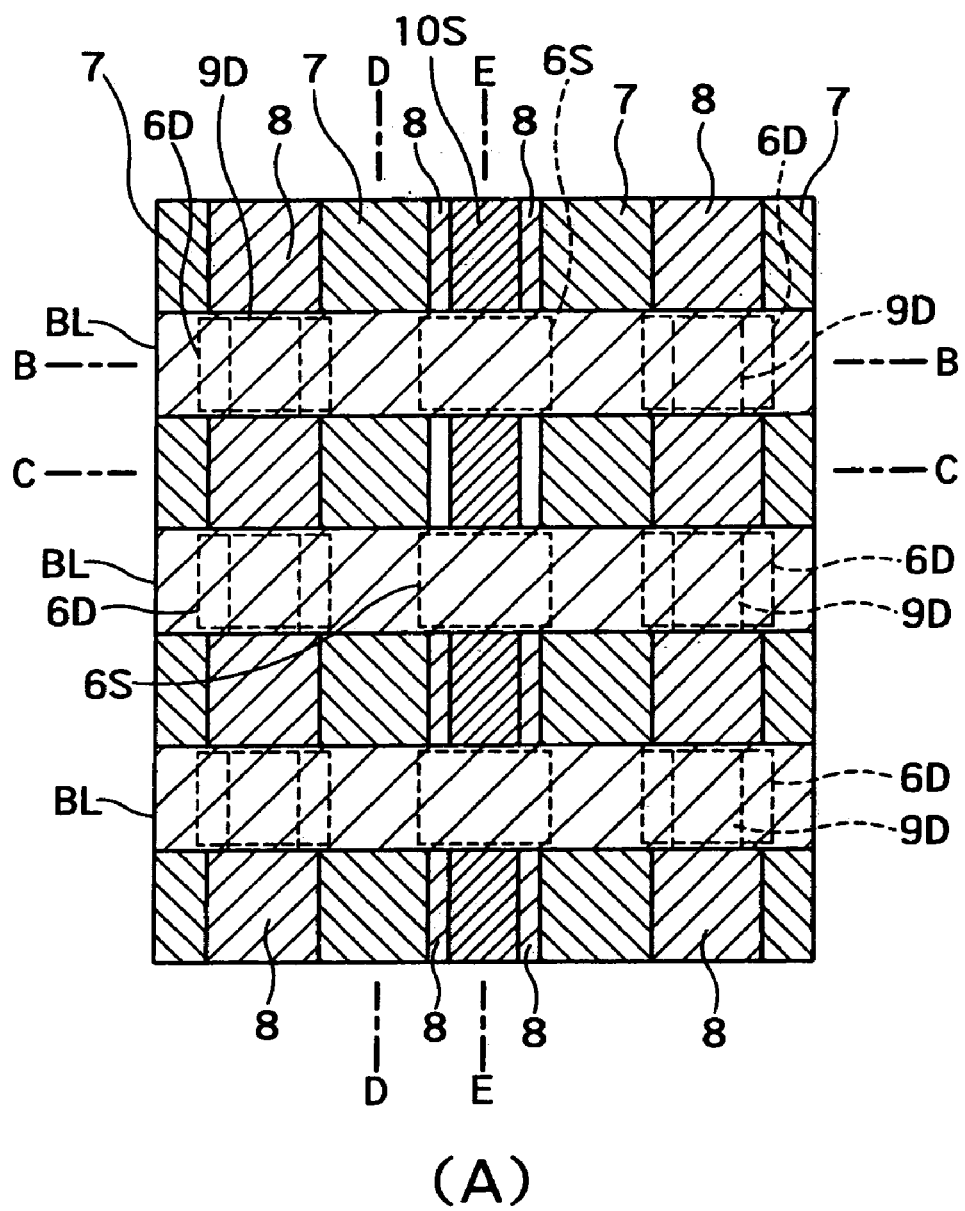
FIG. 22 is a plan view of a conventional semiconductor device.
Figure 23:
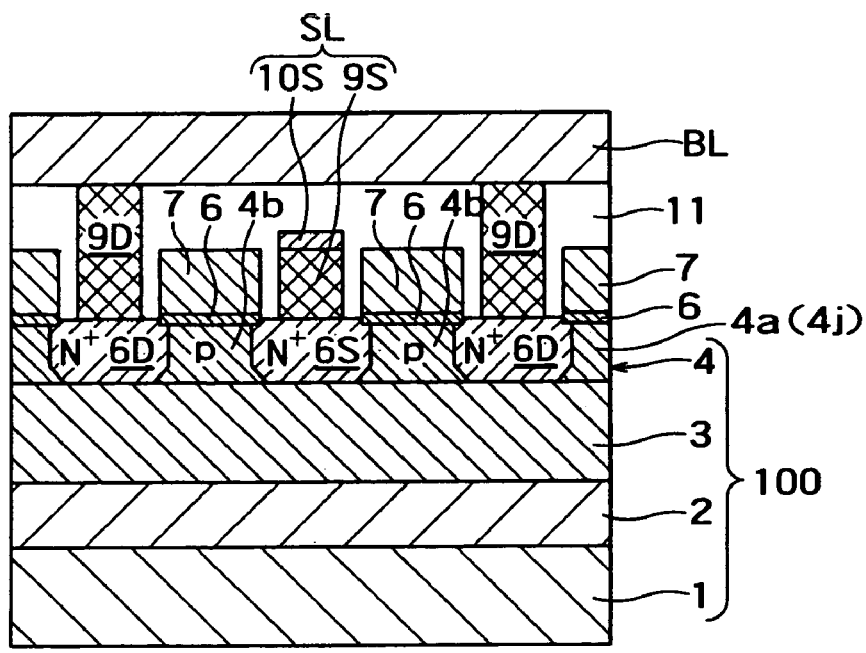
FIG. 23 shows sectional views of the semiconductor device, taken along lines B—B and C—C, respectively, in FIG. 21.
Figure 23:
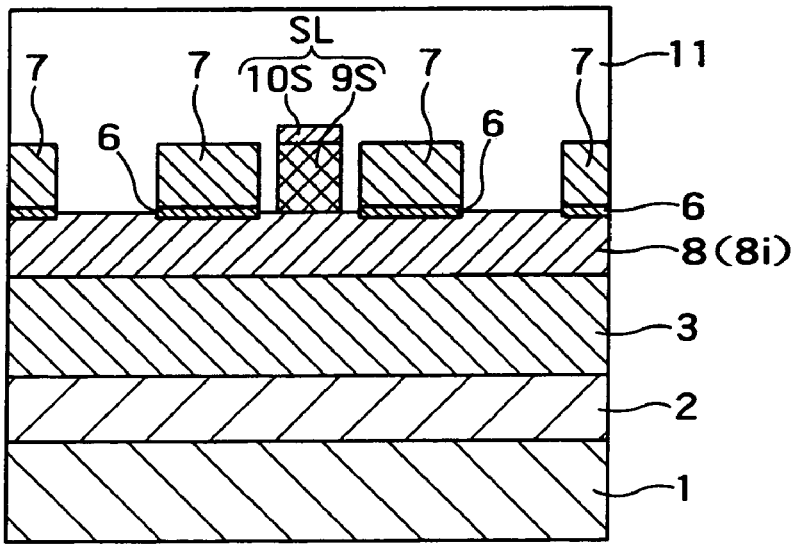
Figure 24:
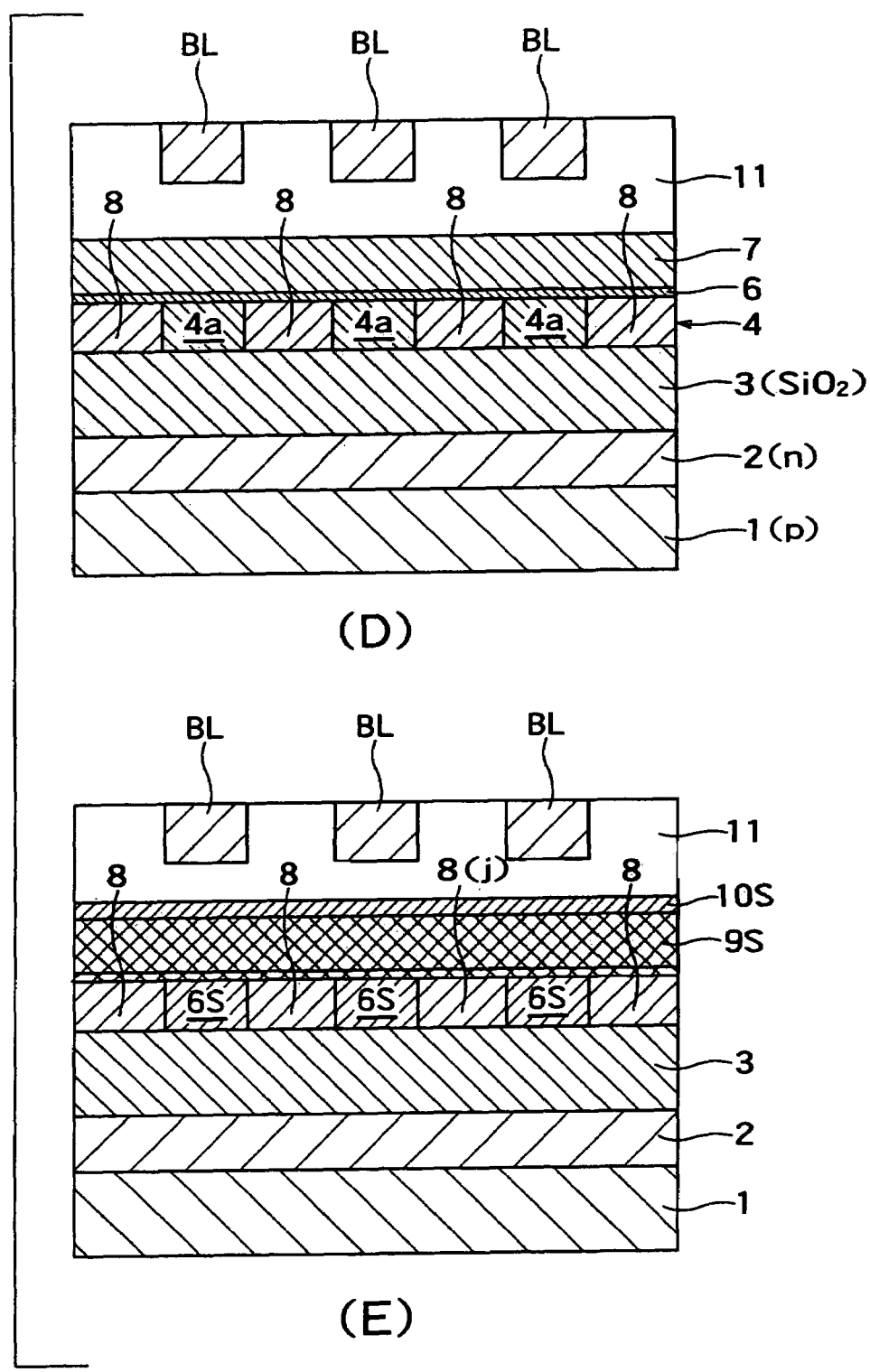
FIG. 24 shows sectional views of the semiconductor device, taken along lines D—D and E—E, respectively, in FIG. 21.
Figure 25:
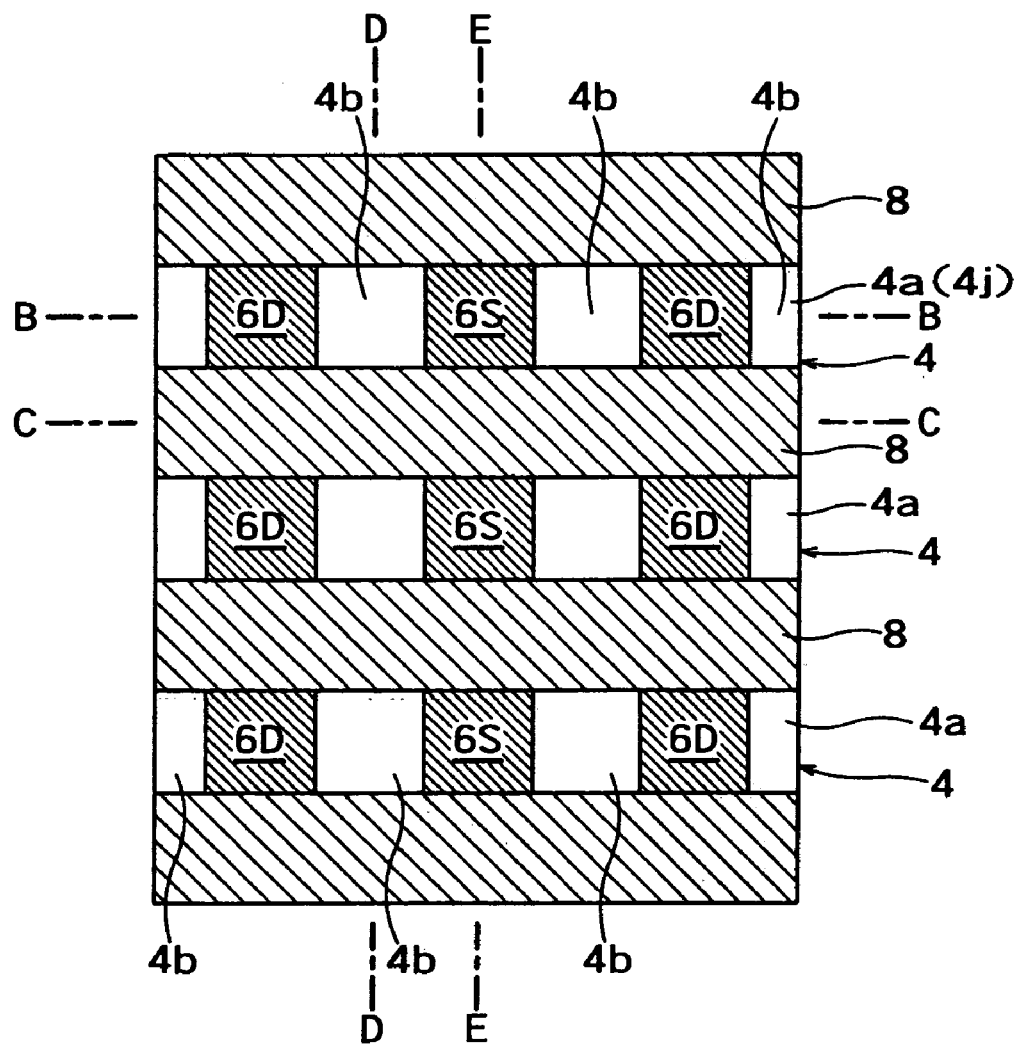
FIG. 25 is a plan view of the semiconductor device in FIGS. 22 to 24, showing a physical relationship among the element isolation films, silicon layers, and source/drain regions.

FIGS. 19 to 21 show together a variant of the semiconductor shown in FIGS. 13 to 15. More particularly, FIG. 19(B) is a sectional view taken along a line B—B in FIG. 19(A), FIG. 20(C) is a sectional view taken along a line C—C in FIG. 19(A), FIG. 20(D) is a sectional view taken along a line D—D in FIG. 19(A), FIG. 21(E) is a sectional view taken along a line E—E in FIG. 19(A), FIG. 21 (F) is a plane view of the semiconductor device with a part of the latter omitted. In this semiconductor device, the element isolation region is made as a lamination (three-layer structure) of an embedded oxide film 3, polysilicon film 31 and element isolation film 8 as will be seen from FIG. 20(D).

Because of this construction, the floating body portion (element region 4*a*) of the element region can be capacitive-coupled to the polysilicon film 31, which permits to increase the signal amount during read, as having been described with reference to FIGS. 16 to 18.

Also in the semiconductor device, the element isolation films 8 are cut by cutting recesses 8*a* formed at the middle of the films 8 as seen in FIG. 21(F).

As having been described in the foregoing, even if the memory of the FBC structure is highly miniaturized in the semiconductor device according to the present invention, the elements can be isolated sufficiently while keeping the cell area small. Thus, it is possible to prevent the bipolar operation that should never normally take place between adjacent cells and the malfunction due to data interference.

The invention claimed is:

1. A semiconductor device comprising:
   a support substrate;
   an embedded insulating layer formed on the support substrate;
   a semiconductor layer on the embedded insulating layer;
   at least an element region formed in the semiconductor layer;
   a plurality of source/drain regions of a first conductivity type, formed in the element region at predetermined intervals;
   a plurality of body regions of a second conductivity type, sandwiched between a pair of adjacent ones of the source/drain regions in the element region; and
   a gate formed on each of the body regions with a gate insulating film being laid between them,
   each of the source/drain regions including:
   an inner high-concentration portion extending to the embedded insulating layer, and
   an outer low-concentration portion surrounding the inner high-concentration portion, having a direct contact with the body regions and extending to the embedded insulating layer.

2. The semiconductor device according to claim 1, wherein the high-concentration portion of the source/drain region includes elements larger in atomic number than those included in the low-concentration portion.

3. The semiconductor device according to claim 1, wherein the semiconductor in the high-concentration portion is in an amorphous state.

4. The semiconductor device according to claim 1, wherein the body region is configured to be able to store a charge developed when current flows between two source/drain regions both sides of the body region.

5. The semiconductor device according to claim 1, wherein each of the source/drain regions includes an upper extension region and a diffusion region smaller in diameter than the upper extension region.

6. The semiconductor device according to claim 1, wherein on each of the source/drain regions, a conductive layer is formed.

7. The semiconductor device according to claim 6, wherein both sides of each of the gates are adjacent to the conductive layers, with a multilayer of an oxide film and a nitride film.

* * * * *